(12) United States Patent
Hayashi et al.

(10) Patent No.: US 6,632,993 B2
(45) Date of Patent: Oct. 14, 2003

(54) PHOTOVOLTAIC MODULE

(75) Inventors: Katsuhiko Hayashi, Shiga (JP); Yuko Tawada, Osaka (JP); Tomomi Meguro, Shiga (JP); Akihiko Nakajima, Hyougo (JP)

(73) Assignee: Kaneka Corporation, Osaka (JP)

( * ) Notice: Subject to any disclaimer, the term of this patent is extended or adjusted under 35 U.S.C. 154(b) by 0 days.

(21) Appl. No.: 09/970,340

(22) Filed: Oct. 2, 2001

(65) Prior Publication Data

US 2002/0066478 A1 Jun. 6, 2002

(30) Foreign Application Priority Data

| Oct. 5, 2000 | (JP) | 2000-305809 |
| Mar. 1, 2001 | (JP) | 2001-057056 |
| Mar. 1, 2001 | (JP) | 2001-057057 |
| Mar. 5, 2001 | (JP) | 2001-060565 |

(51) Int. Cl.$^7$ ............ H01L 31/0352; H01L 31/05
(52) U.S. Cl. ............ 136/256; 136/244; 257/466
(58) Field of Search ............ 136/244, 255, 136/256; 257/431, 461, 466

(56) References Cited

U.S. PATENT DOCUMENTS 4,668,840 A * 5/1987 Kiyama et al. ............ 136/244
5,603,778 A * 2/1997 Sonoda ............ 136/259

FOREIGN PATENT DOCUMENTS

| JP | 09-129903 | 5/1997 |
| JP | 09-129906 | 5/1997 |

* cited by examiner

*Primary Examiner*—Nam Nguyen
*Assistant Examiner*—Brian L Mutschler
(74) *Attorney, Agent, or Firm*—Hogan & Hartson, LLP

(57) ABSTRACT

There is provided a photovoltaic module including a transparent substrate and hybrid photovoltaic cells arrayed on the substrate and series connected to each other, the cells including a back electrode facing the substrate, a transparent front electrode intervening between the substrate and the back electrode, a first photovoltaic layer intervening between the front and back electrodes and including an amorphous semiconductor layer, a second photovoltaic layer intervening between the first photovoltaic layer and the back electrode and including a crystalline semiconductor layer, and a conductive interlayer with a light-transmitting-and-reflecting property intervening between the first and second photovoltaic layers and having a thickness in a range of 10 nm to 100 nm and a specific resistance in a range of $1 \times 10^{-3}$ $\Omega \cdot$cm to less than $1 \times 10^{-1}$ $\Omega \cdot$cm.

9 Claims, 6 Drawing Sheets

PHOTOVOLTAIC MODULE

CROSS-REFERENCE TO RELATED APPLICATIONS

This application is based upon and claims the benefit of priority from the prior Japanese Patent Applications No. 2000-305809, filed Oct. 5, 2000, No. 2001-057056, filed Mar. 1, 2001, No. 2001-057057, filed Mar. 1, 2001; and No. 2001-060565, filed Mar. 5, 2001, the entire contents of all of which are incorporated herein by reference.

BACKGROUND OF THE INVENTION

1. Field of the Invention

The present invention relates to a photovoltaic module and to the manufacturing method thereof, and in particular, to a photovoltaic module including hybrid-type photovoltaic cells each provided with a conductive interlayer having a light-transmitting-and-reflecting property, and to the manufacturing method thereof.

2. Description of the Related Art

The photovoltaic module generally has a structure in which a plurality of photovoltaic cells are arrayed in series on a glass substrate. These photovoltaic cells are respectively formed through the depositions on the glass substrate and patterning, of a transparent front electrode, a photovoltaic layer and a back electrode.

This photovoltaic module is demanded to be excellent in conversion efficiency of light to electric power (or power generating efficiency). A module including tandem-type photovoltaic cells, i.e. a tandem-type module has a structure in which a laminate structure of photovoltaic layers differing in absorption band of wavelength from each other intervenes between the front electrode and the back electrode, and is known to be capable of more effectively utilizing the incident light.

A hybrid-type structure which is one kind of tandem-type structure is featured in that the photovoltaic layers are different to each other in crystallinity of intrinsic semiconductor layer which constitutes a main portion of each photovoltaic layer. For example, a module having hybrid-type cells, i.e. a hybrid-type module employs, as the intrinsic semi-conductor layer of the photovoltaic layer disposed on the incident light side (or front side), an amorphous silicon layer having a wider band gap, and also employs, as the intrinsic semiconductor layer of the photovoltaic layer disposed on the rear side, a polysilicon layer having a narrower band gap.

By the way, there is a kind of tandem-type module wherein a conductive interlayer exhibiting a light-transmitting-and-reflecting properties is interposed between a plurality of photovoltaic layers being laminated. Since it is possible, with this interlayer being provided as mentioned above, to enable the light entered into the intrinsic semiconductor layer disposed on the front side to be reflected by this interlayer, the effective thickness of the intrinsic semiconductor layer disposed on the front side can be increased, or in other words, the density of output current of the photovoltaic layer disposed on the front side can be increased.

Therefore, if this interlayer is applied to the aforementioned hybrid-type cell, the density of output current may be well-balanced between the photovoltaic layer having an amorphous silicon layer and the photovoltaic layer having a polysilicon layer while making it possible to make thinner the amorphous silicon layer which may be increasingly photo-induced degraded as the thickness thereof is increased. Namely, the output performance of the module is assumed to be improved.

However, as a matter of fact, it is not necessarily possible, in the hybrid-type module which is provided with the aforementioned interlayer, to realize such an improved output performance as expected.

According to a first aspect of the present invention, there is provided a photovoltaic module including a transparent substrate and hybrid photovoltaic cells arrayed on the substrate and series connected to each other, the cells including a back electrode facing the substrate, a transparent front electrode intervening between the substrate and the back electrode, a first photovoltaic layer intervening between the front and back electrodes and including an amorphous semiconductor layer, a second photovoltaic layer intervening between the first photovoltaic layer and the back electrode and including a crystalline semiconductor layer, and a conductive interlayer with a light-transmitting-and-reflecting property intervening between the first and second photovoltaic layers and having a thickness in a range of 10 nm to 100 nm and a specific resistance in a range of $1 \times 10^{-3}$ $\Omega \cdot cm$ to less than $1 \times 10^{-1}$ $\Omega \cdot cm$.

According to a second aspect of the present invention, there is provided a photovoltaic module including a transparent substrate and hybrid photovoltaic cells arrayed on the substrate and series connected to each other, the cells including a back electrode facing the substrate, a transparent front electrode intervening between the substrate and the back electrode, a first photovoltaic layer intervening between the front and back electrodes and including an amorphous semiconductor layer, a second photovoltaic layer intervening between the first photovoltaic layer and the back electrode and including a crystalline semiconductor layer, and a conductive interlayer with a light-transmitting-and-reflecting property intervening between the first and second photovoltaic layers, wherein, between a first cell and a second cell being adjacent to each other, the front electrode is divided by a first separation groove which is filled with a material of the first photovoltaic layer, a laminate structure including the first photovoltaic layer, the interlayer, the second photovoltaic layer and the back electrode is divided by a second separation groove which is apart from the first separation groove, a laminate structure including the first photovoltaic layer, the interlayer and the second photovoltaic layer is divided by a connection groove between the first and second separation grooves, the connection groove being filled with a material of the back electrode so as to electrically connect the back electrode of the first cell to the front electrode of the second cell, and a laminate structure including the first photovoltaic layer and the interlayer is divided by a third separation groove which is filled with a material of the second photovoltaic layer, the connection groove being positioned between the second and third grooves, and the first and third grooves being apart from each other.

According to a third aspect of the present invention, there is provided a photovoltaic module including a transparent substrate and hybrid photovoltaic cells arrayed on the substrate and series connected to each other, the cells including a back electrode facing the substrate, a transparent front electrode intervening between the substrate and the back electrode, a first photovoltaic layer intervening between the front and back electrodes and including an amorphous semiconductor layer, a second photovoltaic layer intervening between the first photovoltaic layer and the back electrode and including a crystalline semiconductor layer, and a conductive inter layer with a light-transmitting-and-reflecting property intervening between the first and second photovoltaic layers, wherein, between a first cell and a second cell being adjacent to each other, the front electrode is divided by first and fourth grooves which are apart from each other and filled with a material of the first photovoltaic layer, a laminate structure including the first photovoltaic layer, the interlayer, the second photovoltaic layer and the back electrode is divided by a second separation groove, the second and first separation grooves sandwiching the fourth groove, a laminate structure including the first photovoltaic layer, the interlayer and the second photovoltaic layer is divided by a connection groove between the fourth and second separation grooves, the connection groove being filled with a material of the back electrode so as to electrically connect the back electrode of the first cell to the front electrode of the second cell, and a laminate structure including the first photovoltaic layer and the interlayer is divided by a third separation groove which is filled with a material of the second photovoltaic layer and positioned between the first and fourth grooves, wherein a bottom surface of the third separation groove includes a surface of the transparent front electrode.

According to a fourth aspect of the present invention, there is provided a photovoltaic module including a transparent substrate and hybrid photovoltaic cells arrayed on the substrate and series connected to each other, the cells including a back electrode facing the substrate, a transparent front electrode intervening between the substrate and the back electrode, a first photovoltaic layer intervening between the front and back electrodes and including an amorphous semiconductor layer, a second photovoltaic layer intervening between the first photovoltaic layer and the back electrode and including a crystalline semiconductor layer, and a conductive interlayer with a light-transmitting-and-reflecting property intervening between the first and second photovoltaic layers, wherein, between a first cell and a second cell being adjacent to each other, the front electrode is divided by a first separation groove which is filled with a material of the first photovoltaic layer, a laminate structure including the first photovoltaic layer, the interlayer, the second photovoltaic layer and the back electrode is divided by a second separation groove which is apart from the first separation groove, a laminate structure including the first photovoltaic layer, the interlayer and the second photovoltaic layer is divided by a connection groove between the first and second separation grooves, the connection groove being filled with a material of the back electrode so as to electrically connect the back electrode of the first cell to the front electrode of the second cell, and a laminate structure including the front electrode, the first photovoltaic layer and the interlayer is divided by a third separation groove which is filled with a material of the second photovoltaic layer, the connection groove being positioned between the second and third grooves, and the first and third grooves being apart from each other.

According to a fifth aspect of the present invention, there is provided a photovoltaic module including a transparent substrate and hybrid photovoltaic cells arrayed on the substrate and series connected to each other, the cells including a back electrode facing the substrate, a transparent front electrode intervening between the substrate and the back electrode, a first photovoltaic layer intervening between the front and back electrodes and including an amorphous semiconductor layer, a second photovoltaic layer intervening between the first photovoltaic layer and the back electrode and including a crystalline semiconductor layer, and a conductive interlayer with a light-transmitting-and-reflecting property intervening between the first and second photovoltaic layers, wherein, between a first cell and a second cell being adjacent to each other, a laminate structure including the front electrode, the first photovoltaic layer and the interlayer is divided by a first separation groove which is filled with a material of the second photovoltaic layer, a laminate structure including the first photovoltaic layer, the interlayer, the second photovoltaic layer and the back electrode is divided by a second separation groove which is apart from the first separation groove, and a laminate structure including the first photovoltaic layer, the interlayer and the second photovoltaic layer is divided by a connection groove between the first and second separation grooves, the connection groove bordering on the first separation groove and being filled with a material of the back electrode so as to electrically connect the back electrode of the first cell to the front electrode of the second cell. The material filling the connection groove and the material filling the first separation groove are in direct contact with each other and a contact surface of the material filling the connection groove that is in direct contact with the material filling the first separation groove extends from a back surface of the front electrode to a front surface of the back electrode.

The term "crystalline" employed herein is to be interpreted inclusively and is meant to include "polycrystalline" and also "microcrystalline". Further, these "polycrystalline" and "microcrystalline" may contain therein an "amorphous".

Additional advantages of the invention will be set forth in the description which follows, and in part will be obvious from the description, or may be learned by practice of the invention. The advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
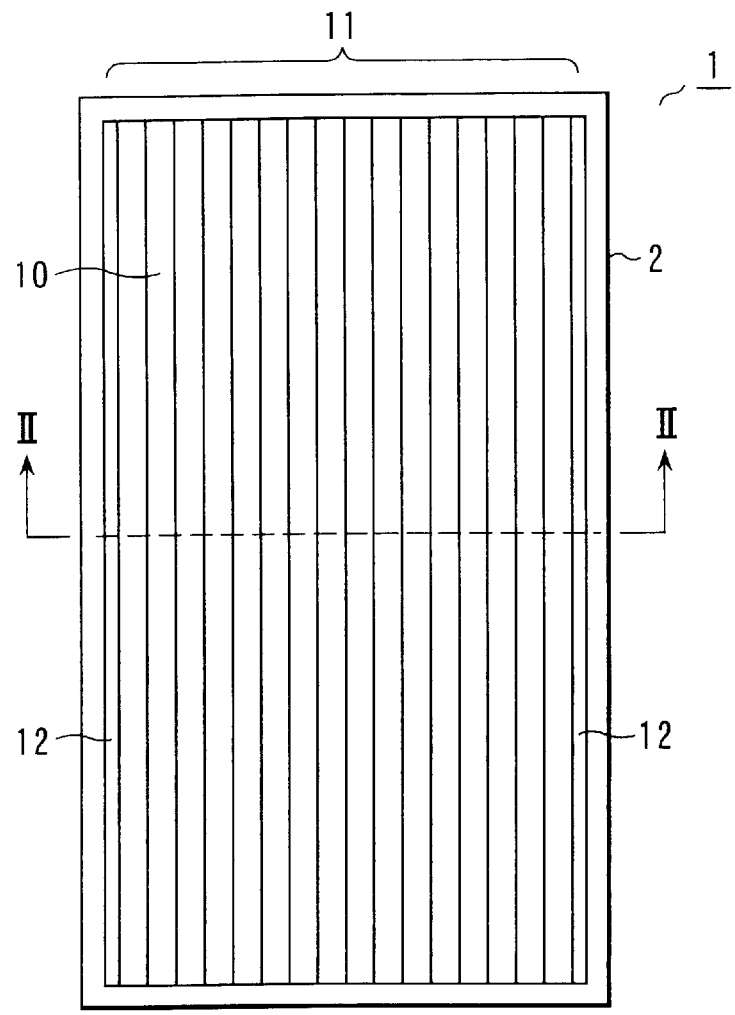
FIG. 1 is a plane view schematically showing the photovoltaic module according to a first embodiment of the present invention.

Several embodiments of the present invention will be described with reference to the accompanying drawings. By the way, the components which are common in these drawing are denoted by the same reference numerals thereby omitting the repeated explanation thereof.

The present inventors have investigated as for the reasons which make it impossible to realize such an output performance as expected of the conventional hybrid-type module which is provided with the aforementioned interlayer. As a result, the following fact has been found as being one of the main reasons.

In the tandem-type photovoltaic module, the electric connection between the back electrode of a given photovoltaic cell and the transparent front electrode of another photovoltaic cell adjacent to the given photovoltaic cell is realized by the provision of a connection groove passing through a plurality of photovoltaic layers as well as an interlayer interposed therebetween, the connection groove being filled with a material constituting the back electrode. Namely, the conductive body filling the connection groove is in contact with the light-reflective interlayer.

Since this interlayer is electrically conductive as mentioned above, this interlayer functions also as an electrode. Further, in the tandem-type photovoltaic module, a plurality of photovoltaic layers to be included in a single photovoltaic cell are assumed as being connected in series with each other. Therefore, according to the conventional module, a leak current is caused to generate through the interlayer as well as through the conductive material filling the connection groove. As a result, it has been impossible to effectively take up the electric power that has been generated at the photovoltaic layer interposed between the back electrode and the interlayer.

According to the following first to sixth embodiments, however, the generation of such a leak current can be inhibited, thereby making it possible to achieve a high output performance.

FIG. 1 is a plane view schematically showing a photovoltaic module according to a first embodiment of the present invention. In the photovoltaic module shown in FIG. 1, a plurality of photovoltaic cells 10 are arrayed on a transparent substrate 2. These photovoltaic cells 10 have stripe-like configurations and are series-connected with each other, thereby constructing a series array 11. A pair of bus bar electrodes 12 each formed of ribbon-like copper foil are attached to both ends of the series array 11.

In the followings, this module shown in FIG. 1 will be further explained in detail with reference to FIG. 2.

Figure 2:
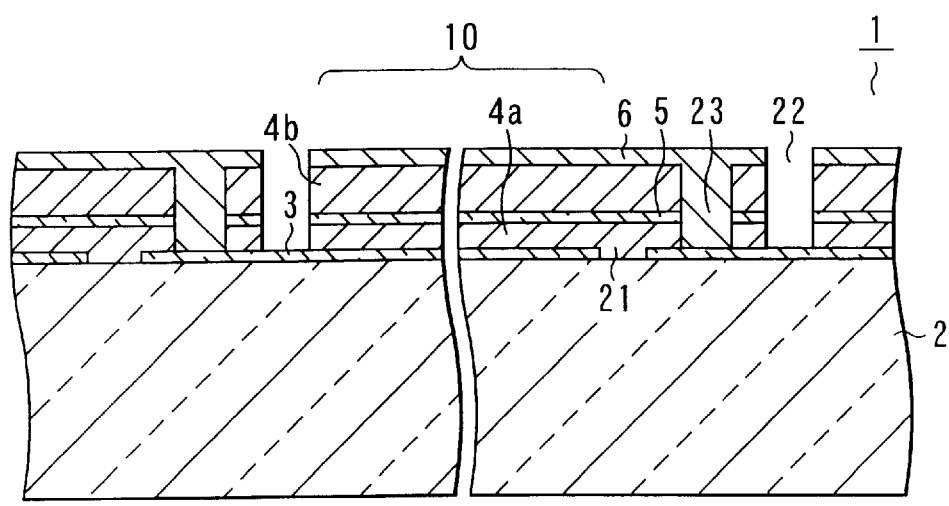
FIG. 2 is a cross-sectional view of the photovoltaic module taken along the line II—II of FIG. 1.

FIG. 2 is a cross-sectional view of the photovoltaic module 1 taken along the line II—II of FIG. 1. By the way, only part of the module 1 is depicted in FIG. 2.

As shown in FIG. 2, the photovoltaic cells 10 of the module 1 are respectively constructed such that a transparent front electrode 3, a first photovoltaic layer 4a including an amorphous semiconductor layer, an interlayer 5, a second photovoltaic layer 4b including a crystalline semiconductor layer, and a back electrode 6 are laminated successively on the transparent substrate 2. Namely, this module 1 is designed such that the incident light from the transparent substrate 2 side is converted into an electric power by means of these photovoltaic layers 4a and 4b constituting a hybrid-type structure.

The photovoltaic module 1 according to this embodiment is provided with a first separation groove 21 and a second separation groove 22 both dividing the aforementioned layers, and with a connection groove 23. These first and second separation grooves 21 and 22 and connection groove 23 are formed parallel with each other and extended in the direction perpendicular to the plane of drawings. The boundary between cells adjacent to each other is defined by these first and second separation grooves 21 and 22.

The first separation groove 21 divides the transparent front electrode 3 correspondently with each of the cells 10, and has an opening at a level of an interface between the front electrode 3 and the photovoltaic layer 4a, a bottom surface of the first separation groove 21 being constituted by the surface of the substrate 2. The first separation groove 21 is filled with the amorphous material of the photovoltaic layer 4a, thereby electrically insulating the adjacent front electrodes 3 from each other.

The second separation groove 22 is formed away from the first separation groove 21. This second separation groove 22 divides the photovoltaic layers 4a and 4b, the interlayer 5 and the back electrode 6 correspondently with each of the cells 10, and has an opening in the exposed surface of the back electrode 6, a bottom surface of the second separation groove 22 being constituted by the surface of the transparent front electrode 3. This second separation groove 22 functions to electrically insulate the adjacent back electrodes 6 from each other and also insulate the adjacent interlayers 5 from each other at a boundary portion between adjacent cells 10.

The connection groove 23 is formed in a position between the first separation groove 21 and the second separation groove 22. This connection groove 23 divides the photovoltaic layers 4a and 4b, and the interlayer 5, and has an opening at a level of an interface between the photovoltaic layer 4b and the back electrode 6, a bottom surface of the connection groove 23 being constituted by the surface of the front electrode 3. This connection groove 23 is filled with an electrically conductive material as the material of the back electrode 6 such as metal, thereby electrically connecting the back electrode 6 of one of cells 10 adjacent to each other with the front electrode 3 of the other of the adjacent cells 10. Namely, the connection groove 23 as well as the electrically conductive material in the connection groove 23 function to series-connect a plurality of cells 10 arrayed on the substrate 2 with each other.

Next, each of the constituent elements of the aforementioned module 1 will be explained.

As for the transparent substrate 2, it is possible to employ, for example, a glass substrate, a transparent resin film, etc.

The transparent front electrode 3 can be constituted by a transparent conductive oxide layer such as an ITO film, an $SnO_2$ film or a ZnO film. Generally, these films are formed as a polycrystalline film. The front electrode 3 may be a monolayer structure or a multi-layer structure. This front electrode 3 can be formed by means of a known vapor-phase deposition method such as an evaporation method, a CVD method or a sputtering method.

The surface of the front electrode 3 should preferably be formed so as to have a surface-textured structure including a fine roughened surface, or so-called textured pattern. When the surface of the front electrode 3 is provided with such a textured pattern, the incidence efficiency of light into the photovoltaic layer 4 can be improved. There is not any particular limitation with respect to the method of forming the textured pattern, and hence, various known methods can be employed.

The photovoltaic layer 4a includes an amorphous semiconductor layer. For example, the photovoltaic layer 4a has a structure in which a p-type silicon-based semiconductor layer, a silicon-based amorphous semiconductor layer and an n-type silicon-based semiconductor layer are successively laminated on the front electrode 3. These p-type semiconductor layer, amorphous semiconductor layer and n-type semiconductor layer can be formed by means of plasma CVD method.

The photovoltaic layer 4b includes a crystalline semiconductor layer. For example, the photovoltaic layer 4b has a structure in which a p-type silicon-based semiconductor layer, a silicon-based crystalline semiconductor layer and an n-type silicon-based semiconductor layer are successively laminated on the interlayer 5. These p-type semiconductor layer, crystalline semiconductor layer and n-type semiconductor layer can be formed by means of plasma CVD method.

The p-type semiconductor layer included in these photovoltaic layers 4a and 4b can be formed by doping p-type conductivity-determining impurity atoms such as boron or aluminum into silicon or a silicon alloy such as silicon carbide or silicon germanium. On the other hand, the amorphous semiconductor layer and crystalline semiconductor layer can be formed by making use of an amorphous silicon-based semiconductor material and a crystalline silicon-based semiconductor material, respectively. As for the examples of such materials, it is possible to employ an intrinsic semiconductor of silicon (silicon hydride), or a silicon alloy such as silicon carbide or silicon germanium. Further, a weak p-type or weak n-type silicon-based semiconductor material containing a trace of conductivity-determining impurity can be employed as a material for the amorphous semiconductor layer and crystalline semiconductor layer as long as they are capable of exhibiting a sufficient photoelectric conversion characteristic. On the other hand, the n-type semiconductor layer can be formed by doping n-type conductivity-determining impurity atoms such as phosphorus or nitrogen into silicon or a silicon alloy such as silicon carbide or silicon germanium.

The photovoltaic layer 4a differs from the photovoltaic layer 4b in terms of absorption wavelength band. For example, when the amorphous semiconductor layer of the photovoltaic layer 4a is formed of an amorphous silicon layer, and the crystalline semiconductor layer of the photovoltaic layer 4b is formed of a crystalline silicon layer, a light component having a wavelength of 550 nm or so can be most effectively absorbed by the former layer, while a light component having a wavelength of 900 nm or so can be most effectively absorbed by the latter layer.

The thickness of photovoltaic layer 4a should preferably be in the range of 0.01 μm to 0.5 μm, more preferably in the range of 0.1 μm to 0.3 μm. Since it is possible, in the module according to this embodiment, to enable the light entered from outside into the photovoltaic layer 4a to be reflected by this interlayer 5, the effective thickness of the photovoltaic layer 4a can be increased. Therefore, it is now possible to maintain a sufficiently high output current density even if the thickness of the photovoltaic layer 4a is made thinner for the purpose of inhibiting the photo-induced degradation thereof.

On the other hand, the thickness of photovoltaic layer 4b should preferably be in the range of 0.1 μm to 10 μm, more preferably in the range of 0.1 μm to 5 μm. Namely, the thickness of photovoltaic layer 4b should preferably be several to ten times as large as that of the photovoltaic layer 4a. This is because the photo-absorption coefficient of the crystalline semiconductor layer is smaller than that of the amorphous semiconductor layer.

The interlayer 5 is featured in that it exhibits light-transmitting-and-reflecting properties. Further, the interlayer 5 is electrically conductive. As for the specific examples of the interlayer 5, it is possible to employ a transparent oxide layer such as a ZnO film, an $SiO_2$ film, an $SnO_2$ film, an $InO_2$ film, an $Al_2O_3$ film, a $Y_2O_3$ film and a $TiO_2$ film. More preferably, a transparent conductive oxide layer such as a ZnO film should be employed for the interlayer 5. These films are frequently formed in the form of polycrystal. This interlayer 5 can be formed by a known vapor-phase deposition method such as an evaporation method, a CVD method and a sputtering method.

The back electrode 6 generally functions not only as an electrode but also as a reflection layer which permits the light that has reached the back electrode 6 after entering into the photovoltaic layers 4a and 4b from the transparent substrate 2 to re-enter into the photovoltaic layers 4a and 4b. This back electrode 6 can be formed to have a thickness of 200 nm to 400 nm for instance by making use of a metallic material such as silver or aluminum and by means of an evaporation method or a sputtering method. This back electrode 6 may be further provided, on the surface thereof facing the photovoltaic layer 4b, with a transparent conductive thin film (not shown) made of a non-metallic material such as ZnO for the purpose of improving the adhesivity between the conductive thin film made of a metal for example and the photovoltaic layer 4b.

The aforementioned module 1 can be manufactured by the method explained as follows.

First of all, a transparent front electrode 3 is formed as a continuous film on one of main surfaces of the transparent substrate 2. Then, the first separation groove 21 is formed in the front electrode 3 by means of a laser-scribing using YAG laser to divide the front electrode 3 correspondently with each of the cells 10. The electrically conductive fine particles to be produced as a result of the laser-scribing of the front electrode 3 are removed as required by means of ultrasonic cleaning, etc.

Then, the photovoltaic layer 4a is formed as a continuous film on the front electrode 3. As a result of the formation of the photovoltaic layer 4a, the first separation groove 21 that has been formed in the front electrode 3 is concurrently filled with the amorphous material constituting the photovoltaic layer 4a. Then, the interlayer 5 is formed as a continuous film on the photovoltaic layer 4a. Thereafter, the photovoltaic layer 4b is formed as a continuous film on the interlayer 5.

Subsequently, the connection groove 23 is formed in the photovoltaic layers 4a and 4b and the interlayer 5 by means of a laser-scribing using YAG laser, etc. Then, the back electrode 6 is formed on the photovoltaic layer 4b. As a result of the formation of this back electrode 6, the connection groove 23 is concurrently filled with a conductive material such as a metal, thereby permitting the back electrode 6 to be electrically connected with the transparent front electrode 3 through the conductive material filling the connection groove 23.

Then, the second separation groove 22 is formed in the photovoltaic layers 4a and 4b, the interlayer 5, and the back electrode 6 by means of a laser-scribing using YAG laser, etc. Then, a power-generating region is delimited by means of a laser-scribing using YAG laser, etc. Further, a pair of bus bar electrodes 12 are attached to the both sides of the array constituted by the cells 10, thus obtaining the structure as shown in FIGS. 1 and 2.

By the way, the photovoltaic module 1 is generally provided, on the rear side thereof, with an organic protective film (not shown) with a sealing resin layer (not shown) being interposed therebetween. This sealing resin layer is designed to seal each of the photovoltaic cells 10 formed on the transparent substrate 2, and is formed of a resin which enables the organic protective film to be adhered to these cells 10.

Specific examples of such a resin includes EVA (ethylene/vinyl acetate copolymer) for instance. As for the organic protective film, it is possible to employ a polyvinyl fluoride film (for example, Tedlar film (registered trademark)). These sealing resin/organic protective films can be concurrently adhered to the rear side of the photovoltaic module 1 by means of vacuum laminating method.

According to this embodiment, the specific resistance of the interlayer 5 is confined within the range of $1\times10^{-3}$ $\Omega\cdot$cm to $1\times10^{-1}$ $\Omega\cdot$cm, preferably within the range of $1\times10^{-2}$ $\Omega\cdot$cm to $1\times10^{-1}$ $\Omega\cdot$cm. Further, this thickness of the interlayer 5 is confined within the range of 10 nm to 100 nm, preferably within the range of 20 nm to 70 nm. When the specific resistance and thickness of the interlayer 5 are confined within the aforementioned ranges, it becomes possible to inhibit an electric current from flowing in the direction in-plane of the interlayer 5. Therefore, according to this embodiment, it becomes possible to suppress the generation of leak current. Further, when the specific resistance and thickness of the interlayer 5 are confined within the aforementioned ranges, it becomes possible to prevent the electric resistance between the photovoltaic layer 4a and the photovoltaic layer 4b from becoming excessively higher. Additionally, when the specific resistance and thickness of the interlayer 5 are confined within the aforementioned ranges, the following advantages can be obtained The second separation groove 22 and the connection groove 23 can be formed by utilizing the heat and/or kinetic energy to be generated from the fusion or sublimation of a portion of the photovoltaic layer 4a by the irradiation of laser beam. Therefore, if the photovoltaic layer 4a is excessively thin, the second separation groove 22 and the connection groove 23 may become discontinuous, making the electric insulation or electric connection thereof incomplete. On the other hand, if the photovoltaic layer 4a is excessively thick, it will lead to the photo-induced degradation thereof. Further, since the photo-absorption coefficient of the crystalline semiconductor layer is smaller than that of the amorphous semiconductor layer, the thickness of photovoltaic layer 4b should preferably be several to ten times as large as that of the photovoltaic layer 4a. Because of this, the thickness of the photovoltaic layer 4a should preferably be within the range of 0.01 μm to 0.5 μm, more preferably within the range of 0.1 μm to 0.3 μm. Whereas the thickness of the photovoltaic layer 4b should preferably be within the range of 0.1 μm to 10 μm, more preferably within the range of 0.1 μm to 5 μm.

As described above, the thickness of the interlayer 5 according to this embodiment is confined within the range of 10 nm to 100 nm, more preferably within the range of 20 nm to 70 nm. When the thickness of the interlayer 5 is confined within the aforementioned range, it becomes easy to well-balance the output current of the photovoltaic layer 4a with the output current of the photovoltaic layer 4b on the occasion where the thickness of the photovoltaic layer 4a and the thickness of the photovoltaic layer 4b are respectively confined within the aforementioned ranges. Therefore, it is possible according to this embodiment to easily realize excellent output performance.

According to this embodiment, the interlayer 5 may be formed using a transparent conductive oxide such as zinc oxide, tin oxide and indium tin oxide. However, a transparent conductive oxide is generally lower in oxygen concentration as compared with the stoichiometric concentration thereof, and exhibits an n-type conductivity. Namely, the specific resistance of such a transparent conductive oxide tends to become low. If it is desired to employ a transparent conductive oxide as a material for the interlayer 5, the transparent conductive oxide may be doped with an impurity such as aluminum or gallium to adjust the specific resistance of the interlayer 5. Additionally, the oxygen concentration in the transparent conductive oxide may be increased to enlarge the specific resistance of the interlayer 5.

According to the first embodiment explained above, the thickness and specific resistance of the interlayer 5 are confined within predetermined ranges to make it possible to inhibit the generation of leak current. It is assumed that the generation of such a leak current can be also suppressed by adopting the structures set forth in Jpn. Pat. Appln. KOKAI Publications No. 9-129903 and No. 9-129906. The structures disclosed in these patent publications are shown in FIGS. 3A and 3B.

Figure 3A:
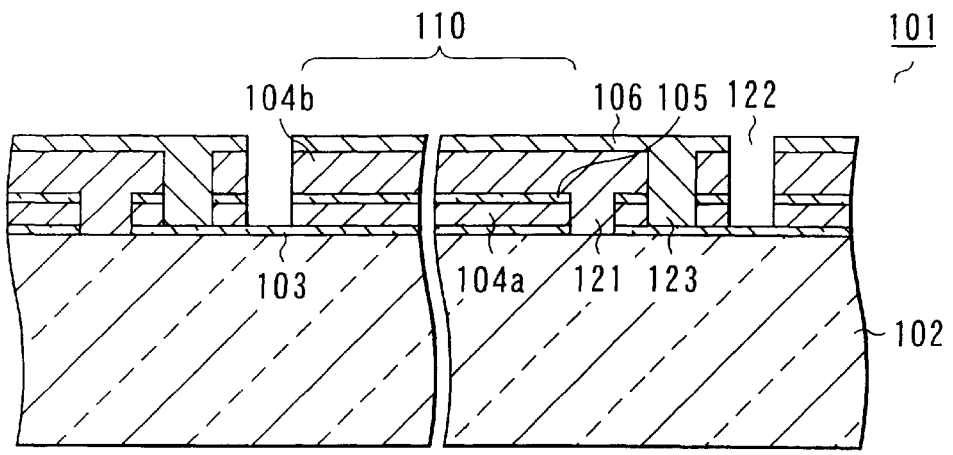
FIGS. 3A and 3B are cross-sectional views each schematically showing the conventional photovoltaic module of tandem-type structure.
Figure 3B:
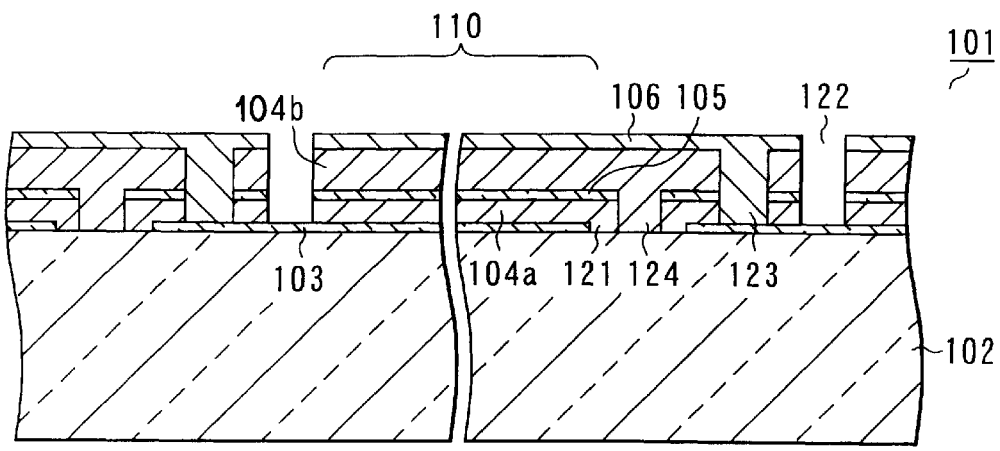

Namely, FIGS. 3A and 3B are cross-sectional views each schematically showing a conventional photovoltaic module wherein the tandem-type structure is adopted. Each of the photovoltaic modules 101, shown in FIGS. 3A and 3B, is constructed such that a transparent front electrode 103, a photovoltaic layer 104a, an interlayer 105, a photovoltaic layer 104b, and a back electrode 106 are laminated successively on a glass substrate 102. By the way, the reference numerals 121, 122 and 124 denote separation grooves, and the reference numeral 123 denotes a connection groove.

In the photovoltaic module 101 shown in FIG. 3A, the front electrode 103 is divided correspondently with each of the photovoltaic cells 110 by a separation groove 121 which has an opening at a level of an interface between the interlayer 105 and the photovoltaic layer 104b. Namely, this separation groove 121 divides not only the front electrode 103 but also the interlayer 105. Therefore, a portion of the interlayer 105 which is located inside the photovoltaic cell 110 is spaced apart from the other portion of the interlayer 105.

In the photovoltaic module 101 shown in FIG. 3B, the front electrode 103 is divided correspondently with each of the photovoltaic cells 110 by a separation groove 121 which has an opening at a level of an interface between the front electrode 103 and the photovoltaic layer 104a. The interlayer 105 is divided by a separation groove 124 which has an opening at a level of an interface between the interlayer 105 and the photovoltaic layer 104b and whose bottom surface is constituted by the surface of glass substrate 202 which is exposed to the interior of the separation groove 121. Namely, as in the case shown in FIG. 3A, the photovoltaic module 101 shown in FIG. 3B also constructed such that a portion of the interlayer 105 which is located inside the cell 110 is spaced apart from the other portion of the interlayer 105.

As explained above, since each of the photovoltaic modules 101 shown in FIGS. 3A and 3B is constructed such that a portion of the interlayer 105 which is located inside the photovoltaic cell 110 is spaced apart from the other region of the interlayer 105, it is assumed that the generation of leak current between the portion of the interlayer 105 which is located inside the cells 110 and the back electrode 106 via the metal filled in the connection groove 123 can be prevented. As a matter of fact, it has been confirmed that when an amorphous semiconductor layer is employed as a semiconductor layer for each of the photovoltaic layers 104a and 104b, it is possible to prevent the generation of such a leak current and hence to realize a sufficient output performance. Therefore, even in the case where one of the structures shown in FIGS. 3A and 3B is applied to the hybrid-type module, it is expected that a sufficient output performance can be realized as well.

However, as a matter of fact, it has been found that when one of the structures shown in FIGS. 3A and 3B is applied to the hybrid-type module, it is not necessarily possible to realize such a sufficient output performance as expected.

The present inventors have investigated as for the reasons which make it difficult to realize excellent output performance when one of the structures shown in FIGS. 3A and 3B is applied to the hybrid-type module. As a result, the following fact has been found as being one of the main reasons.

Namely, when one of the structures shown in FIGS. 3A and 3B is applied to the hybrid-type module, the separation groove 121 of FIG. 3A or the separation groove 124 of FIG. 3B would be filled with a crystalline substance, since the photovoltaic layer 104b is formed of a crystalline semiconductor layer. However, since the amorphous glass substrate is exposed at each bottom portion of these separation grooves 121 and 124, an amorphous layer is caused to grow at the initial stage in the process of forming the photovoltaic layer 104b, which is followed by the growth of crystalline layer. Namely, each of the separation groove 121 of FIG. 3A and the separation groove 124 of FIG. 3B is filled at first with an amorphous substance and then, with a crystalline substance.

A crystalline layer made of a material such as silicon has a far larger residual stress as compared with an amorphous layer made of a material such as silicon. Therefore, when a crystal is allowed to grow in a very narrow region such as the separation grooves 121 and 124, the crystal located at or near the narrow region would become very brittle due to a difference in crystallinity between the narrow region and a region near the narrow region. Therefore, according to the photovoltaic module 101 shown in FIGS. 3A and 3B, a portion of the photovoltaic layer 104b which is disposed at the regions inside and periphery of these separation grooves 121 and 124 is caused to peel off along with the photovoltaic layer 104a and the interlayer 105 during the process of forming the photovoltaic layer 104b or during the post process thereof.

When such a peeling is caused to occur before the process of forming the back electrode 106, the region where the peeling has taken place would be naturally filled with a metal. If so, it is no longer possible to prevent the generation of leak current between the interlayer 105 and the back electrode 106. The aforementioned fact is considered to be the first reason which makes it impossible to realize a high output performance when the structures shown in FIGS. 3A and 3B are applied to the hybrid-type module.

The second reason for raising the aforementioned problems would be the presence of a crystalline substance between neighboring front electrodes 103. When a material such as silicon is in a crystalline state, the conductivity thereof is much higher than that of the amorphous state thereof. Therefore, when the structures shown in FIGS. 3A and 3B are applied to the hybrid-type module, an electric short-circuit is generated between the neighboring front electrodes 103, thereby making it impossible to realize a high output performance.

The present inventors have assumed on the basis of these facts that if a separation groove for preventing the generation of leak current between the interlayer and the back electrode is disposed away from the separation groove dividing the front electrode, only an amorphous substance can be permitted to interpose between neighboring front electrodes, thereby making it possible to prevent an electric short-circuit between these neighboring front electrodes. Additionally, it has been assumed by the present inventors that if the bottom surface of the separation groove for preventing the generation of leak current between the interlayer and the back electrode is constituted by the top surface of the front electrode formed of a crystalline substance in general, the separation groove can be filled exclusively with a crystalline substance, thereby making it possible to prevent the aforementioned peeling.

Figure 4:
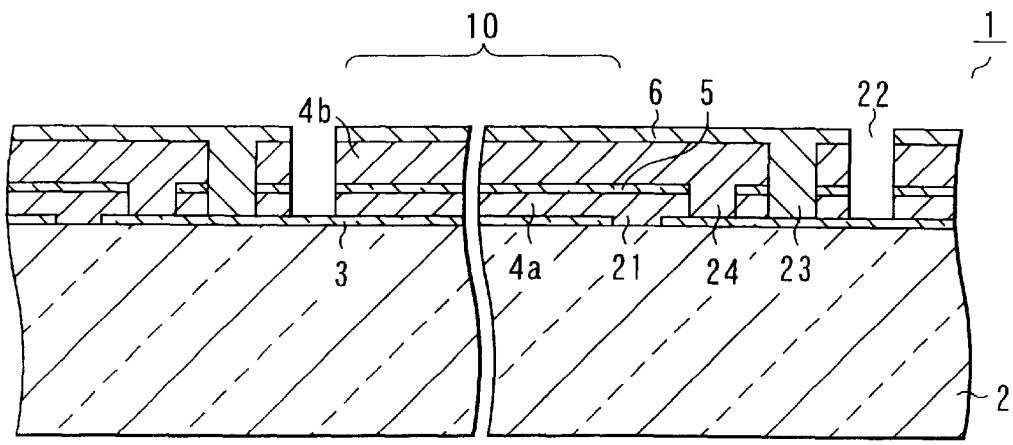
FIG. 4 is a cross-sectional view schematically showing the photovoltaic module according to a second embodiment of the present invention.

FIG. 4 is a cross-sectional view schematically showing the photovoltaic module according to a second embodiment of the present invention. The module 1 shown in FIG. 4 is constructed in almost the same manner as the module 1 shown in FIGS. 1 and 2 except that a third separation groove 24 is disposed therein.

The third separation groove 24 is interposed between the first separation groove 21 and the connection groove 23. Further, the third separation groove 24 divides the photovoltaic layer 4a and the interlayer 5, has an opening at a level of an interface between the interlayer 5 and the photovoltaic layer 4b, and has a bottom surface constituted by the surface of the front electrode 3. This third separation groove 24 is filled with the crystalline material of the photovoltaic layer 4b to electrically insulate the region of the interlayer 5 which is located inside the cell 10 from the conductive material such as metal filling the connection groove 23.

The third separation groove 24 may be disposed in such a way that the first separation groove 21 is interposed between the third separation groove 24 and the connection groove 23. However, when the third separation groove 24 is interposed between the first separation groove 21 and the connection groove 23 as shown in FIG. 4, the effective area useful for the generation of power can be easily enlarged.

The aforementioned module 1 can be manufactured by the method explained as follows.

First of all, in the same manner as explained in the first embodiment, the front electrode 3 is formed as a continuous film on one of main surfaces of the transparent substrate 2. Then, the first separation groove 21 is formed in the front electrode 3. Then, the photovoltaic layer 4a and the interlayer 5 are respectively formed as a continuous film on the front electrode 3.

After the photovoltaic layer 4a and the interlayer 5 are respectively formed as a continuous film as described above, the third separation groove 24 is formed in the photovoltaic layer 4a as well as in the interlayer 5 by means of a laser-scribing using YAG laser, etc. The electrically conductive fine particles to be produced as a result of the laser-scribing of the interlayer 5 are removed as required by means of ultrasonic cleaning, etc.

Then, the photovoltaic layer 4b is formed as a continuous film on the interlayer 5. As a result of the formation of the photovoltaic layer 4b, the third separation groove 24 is concurrently filled with the crystalline material constituting the photovoltaic layer 4b.

Subsequently, in the same manner as explained in the first embodiment, the connection groove 23 is formed in the photovoltaic layers 4a and 4b as well as in the interlayer 5. Then, the back electrode 6 is formed on the photovoltaic layer 4b. Thereafter, the second separation groove 22 is formed in the photovoltaic layers 4a and 4b, the interlayer 5, and the back electrode 6. Then, a power-generating region is delimited. Further, a pair of bus bar electrodes 12 are attached to the both sides of the array constituted by the cells 10, thus obtaining the structure as shown in FIG. 1 and FIG. 4.

According to the module 1 of this second embodiment, since the third separation groove 24 is provided as explained above, it is possible to prevent the generation of leak current between the portion of the interlayer 5 which is located inside the cell 10 and the metal filling the connection groove 23.

Further, since this third separation groove 24 is provided independent from the separation groove 21 dividing the front electrode 3, the separation groove 21 can be filled exclusively with an amorphous material constituting the photovoltaic layer 4a. This amorphous material constituting the photovoltaic layer 4a is much more excellent in electric insulating property as compared with the crystalline material constituting the photovoltaic layer 4b. Therefore, according to this second embodiment, the generation of electric short-circuit between the adjacent front electrodes 3 can be effectively prevented.

Further, according to this second embodiment, the bottom of the third separation groove 24 is constituted by the surface of the front electrode 3. Since the front electrode 3 is generally formed of a crystalline substance, a crystalline layer is permitted to grow on the sidewall and bottom of the third separation groove 24 from the beginning of the process of forming the photovoltaic layer 4b. Therefore, the third separation groove 24 will be filled with a crystalline material. Since the interlayer 5 is usually formed as a polycrystal, the material of the photovoltaic layer 4b can be enabled to grow in the crystalline state from the initial stage of growing process in and around the separation groove 24. As a result, the aforementioned peeling of the photovoltaic layer 4b can be effectively prevented.

As explained above, according to the second embodiment, by way of very simple method where the separation groove 24 is simply disposed at a predetermined position, it is possible to sufficiently derive the effect of the interlayer 5 enabling the output performance of module 1 to be improved. Namely, according to the second embodiment, it is possible to easily realize high output performance of module 1.

In this second embodiment, the transparent substrate 2 should preferably be formed of a glass plate or a transparent resin film. Since these materials are not a crystalline material, if a glass substrate and the like is employed for constituting the transparent substrate 2, the effect that can be derived from the employment of the structure shown in FIG. 4 would become more prominent.

In this second embodiment, the specific resistance and thickness of the interlayer 5 should preferably be selected from those described with reference to the first embodiment. Namely, the specific resistance of the interlayer 5 should preferably be confined within the range of $1.0 \times 10^{-3}$ $\Omega \cdot cm$ to $1.0 \times 10^{-1}$ $\Omega \cdot cm$, preferably within the range of $1.0 \times 10^{-3}$ $\Omega \cdot cm$ to $1 \times 10^{-2}$ $\Omega \cdot cm$. Further, this thickness of the photovoltaic layers 4a and 4b should preferably be selected also from those described with reference to the first embodiment. When the thickness of the photovoltaic layers 4a and 4b is confined as mentioned above, it becomes possible to easily well-balance the output current of the photovoltaic layer 4a with the output current of the photovoltaic layer 4b, while making it possible to further enhance the effect of suppressing the generation of leak current.

Next, a third embodiment of the present invention will be explained. In the aforementioned second embodiment, conductive fine particles to be produced from the interlayer 5 may adhere onto the sidewall of the separation groove 24 on the occasion of forming the separation groove 24. If so, an electric conductive path may be formed starting from the interlayer 5 of one of adjacent cells 10 and reaching the front electrode 3 of the other of the cells 10 via the conductive fine particles that have been adhered onto the sidewall of the separation groove 24. Further, in the aforementioned second embodiment, another electric conductive path extending to the front electrode 3 may be formed through the crystalline substance filling the separation groove 24, i.e. through a p-type semiconductor layer or an intrinsic semiconductor (i-type semiconductor) layer. As a result, leak current (or side leak) is allowed to generate. If the side leak due to the generation of conductive path can be eliminated, the electric power generated in the photovoltaic layer 4b can be more effectively taken out.

In the case where fine particles adhere onto the sidewall of the separation groove 24 on the occasion of forming the separation groove 24 in the structure of the second embodiment, an ultrasonic cleaning may be applied to the sidewall of the separation groove 24 prior to the formation of the photovoltaic layer 4b, thereby making it possible to prevent the generation of side leak. According to this method, however, it becomes necessary to provide a cleaning step and a drying step between the step of forming the separation groove 24 and the step of forming the photovoltaic layer 4b. According to the third embodiment to be explained below, however, the generation of the aforementioned side leak can be prevented without increasing the number of steps.

Figure 5:
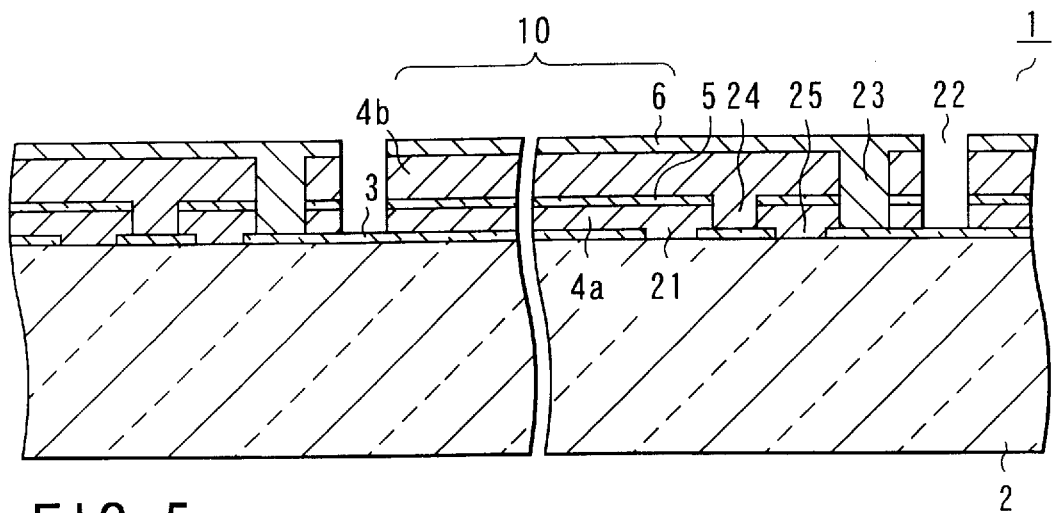
FIG. 5 is a cross-sectional view schematically showing the photovoltaic module according to a third embodiment of the present invention.

FIG. 5 is a cross-sectional view schematically showing the photovoltaic module according to the third embodiment of the present invention. The module 1 shown in FIG. 5 is constructed in almost the same manner as the module 1 shown in FIG. 4 except that a fourth separation groove 25 is disposed therein.

The fourth separation groove 25 is provided such that the third separation groove 24 is interposed between the first separation groove 21 and the fourth separation groove 25, and has an opening at a level of an interface between the front electrode 3 and the photovoltaic layer 4a and a bottom surface constituted by the surface of the substrate 2. This fourth separation groove 25 is filled, in the same manner as the first separation groove 21, with the amorphous material constituting the photovoltaic layer 4a.

According to this structure, even if a conductive path is formed so as to extend from the interlayer 5 disposed close to the cell to the front electrode 3, there is little possibility that an electric conductive path can be formed starting from the interlayer 5 of one of adjacent cells 10 and reaching the front electrode 3 of the other of the cells 10 due to the provision of the separation groove 25 between the separation groove 24 and the connection groove 23. Therefore, according to the module 1 shown in FIG. 5, the generation of side leak due to the formation of conductive path can be prevented, thereby making it possible to realize higher output performance.

Further, since the formation of the separation groove 24 can be performed concurrent with the formation of the separation groove 21, the number of steps is not required to be increased. Namely, according to the third embodiment, almost the same effects as obtainable in the second embodiment can be obtained, and at the same time, higher output performance can be easily realized without increasing the number of steps.

In this third embodiment, the specific resistance and thickness of the interlayer 5 should preferably be selected from those described with reference to the first embodiment. Namely, the specific resistance of the interlayer 5 should preferably be confined within the range of $1.0\times10^{-3}$ Ω·cm to $1.0\times10^{-1}$ Ω·cm, preferably within the range of $1.0\times10^{-3}$ Ω·cm to $1\times10^{-2}$ Ω·cm. Further, this thickness of the photovoltaic layers 4a and 4b should preferably be selected also from those described with reference to the first embodiment. When the thickness of the photovoltaic layers 4a and 4b is confined as mentioned above, it becomes possible to easily well-balance the output current of the photovoltaic layer 4a with the output current of the photovoltaic layer 4b, while making it possible to further enhance the effect of suppressing the generation of leak current.

Next, a fourth embodiment of the present invention will be explained. According to the aforementioned third embodiment, although the generation of side leak can be prevented more effectively without increasing the number of steps, the number of grooves to be formed will be increased by the provision of the separation groove 25 as compared with the second embodiment. Whereas, according to the fourth embodiment to be explained below, the generation of side leak can be prevented without increasing the number of grooves which are required to be formed.

Figure 6:
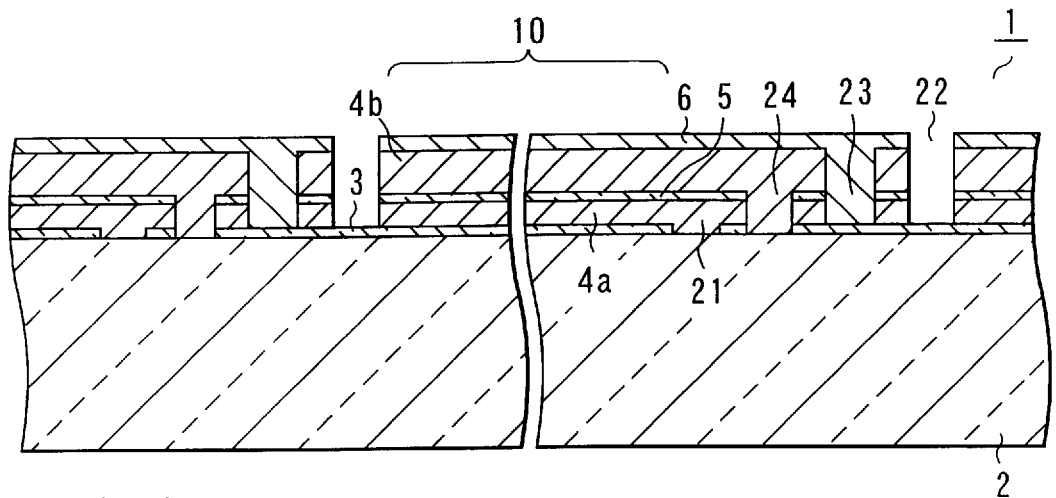
FIG. 6 is a cross-sectional view schematically showing the photovoltaic module according to a fourth embodiment of the present invention.

FIG. 6 is a cross-sectional view schematically showing the photovoltaic module according to the fourth embodiment of the present invention. The module 1 shown in FIG. 6 is constructed in almost the same manner as the module 1 shown in FIG. 4 except that the third separation groove 24 is disposed so as to divide not only the photovoltaic layer 4a and the interlayer 5 but also the transparent front electrode 3.

According to this structure, since a pair of front electrodes 3 which are placed on both sides of the separation groove 24 are electrically insulated, even if the sidewall of the separation groove 24 is adhered with conductive fine particles, there is little possibility that an electric conductive path can be formed starting from the interlayer 5 of one of adjacent cells 10 and reaching the front electrode 3 of the other of the cells 10. Therefore, according to the module 1 shown in FIG. 6, the generation of side leak via the interior of groove can be prevented, thereby making it possible to realize higher output performance. Namely, according to the fourth embodiment, the aforementioned generation of side leak can be prevented without increasing the number of grooves which are required to be formed.

According to this fourth embodiment, since the separation groove 24 is provided as in the second embodiment, it is possible to prevent the generation of leak current between the region of the interlayer 5 which is located inside the cell 10 and the metal filling the connection groove 23.

Further, according to this fourth embodiment, since the separation groove 24 is provided independent from the separation groove 21 as in the second embodiment, the generation of electric short-circuit between the front electrodes 3 of adjacent cells 10 can be effectively prevented.

By the way, according to the structure shown in FIG. 6, since the bottom surface of the separation groove 24 is constituted by the surface of the substrate 2, a thin amorphous layer may be caused to grow inside the separation groove 24 at the initial stage in the process of forming the photovoltaic layer 104b. In this case, as explained above, part of the photovoltaic layer 4b may be caused to peel away from the separation groove 24. If such a peeling is caused to occur in the module 101 shown in FIG. 3A, the separation groove 121 may be filled with a conductive material such as metal on the occasion of forming the back electrode 106, thereby permitting the generation of short-circuit between the back electrode 106 and the front electrode 103 inside a single cell 110, resulting in a prominent deterioration of output performance. Whereas, according to the module 1 shown in FIG. 6, since the separation groove 24 is disposed independent from the separation groove 21, even if such a peeling is caused to occur, there is little possibility that the output performance will be badly deteriorated.

Namely, according to the fourth embodiment, it is possible to easily realize high output performance as in the case of the third embodiment.

In this fourth embodiment, the specific resistance and thickness of the interlayer 5 should preferably be selected from those described with reference to the first embodiment. Namely, the specific resistance of the interlayer 5 should preferably be confined within the range of $1.0\times10^{-3}$ Ω·cm to $1.0\times10^{-1}$ Ω·cm, preferably within the range of $1.0\times10^{-3}$ Ω·cm to $1\times10^{-2}$ Ω·cm. Further, this thickness of the photovoltaic layers 4a and 4b should preferably be selected also from those described with reference to the first embodiment. When the thickness of the photovoltaic layers 4a and 4b is confined as mentioned above, it becomes possible to easily well-balance the output current of the photovoltaic layer 4a with the output current of the photovoltaic layer 4b, while making it possible to further enhance the effect of suppressing the generation of leak current.

Next, a fifth embodiment of the present invention will be explained.

The present inventors have investigated as for the reasons which make it difficult to realize high output performance when the structure shown in FIGS. 3A and 3B is applied to the hybrid-type module. Namely, the present inventors have investigated with regard to the reasons why the effects to be obtained when the aforementioned separation groove is formed in the interlayer differ greatly between the tandem-type structure where each of the photovoltaic layers comprises an amorphous semiconductor layer and the hybrid-type structure. As a result, the following fact is found to be also one of the main reasons.

Generally, the separation groove for preventing side leak is disposed so as to divide not only the interlayer but also the photovoltaic layer interposed between the interlayer and the front electrode. The reason for this is that the dividing of the interlayer is performed by an indirect method wherein the underlying photovoltaic layer is irradiated with a laser beam from the glass substrate side so as to fuse or sublimate the photovoltaic layer, thereby converting the light energy into the heat and/or kinetic energy, which is then employed for removing the regions corresponding to the laser beam-irradiated portions of the interlayer.

When the separation groove is formed in this manner, conductive fine particles are caused to be produced simultaneous with the dividing of the interlayer and are then permitted to adhere onto the sidewall and bottom of the separation groove. Since the conductive fine particles being adhered onto the sidewall and bottom of the separation groove are generally distributed at a relatively low density, the conductive fine particles can be electrically insulated from each other as long as the conductivity of the material filling the separation groove is sufficiently low. Namely, there is little possibility that the conductive fine particles that have been adhered onto the sidewall and bottom of the separation groove will form a conductive path. For this reason, the generation of side leak can be prevented in the tandem-type structure wherein the separation groove is filled with an amorphous material which is relatively low in conductivity.

Whereas, in the hybrid-type structure, since the separation groove is filled with a crystalline substance which is relatively high in conductivity, the insulation between conductive fine particles that have been adhered onto the sidewall and bottom of the separation groove would become insufficient. Therefore, in the hybrid-type structure, a conductive path extending from the interlayer via the sidewall, etc. of the separation groove to the front electrode will be formed, thereby permitting side leak to be generated. This is a third reason.

Based on the aforementioned findings, the present inventors have repeated an intensive study with an assumption that the side leak can be prevented if the conductive fine particles that have been adhered onto the sidewall and bottom of the separation groove can be removed. As a result, it has been found that when an etching method is utilized for the removal of the conductive fine particles, the conductive fine particles can be easily and reliably removed from the sidewall and bottom of the separation groove, and at the same time, the surface of the interlayer can be roughened, thereby forming a surface-textured structure, and enabling to easily realize high output performance.

Figure 7:
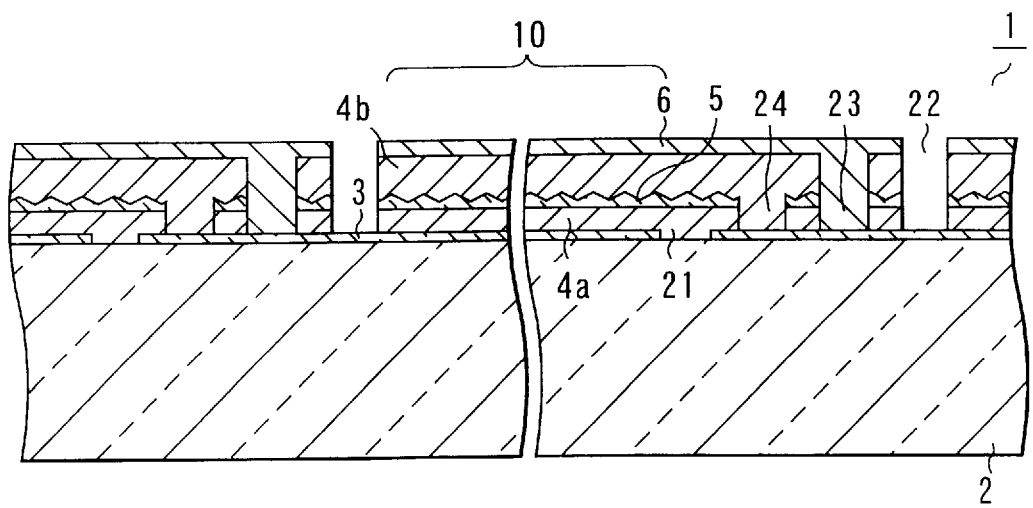
FIG. 7 is a cross-sectional view schematically showing the photovoltaic module according to a fifth embodiment of the present invention.

FIG. 7 is a cross-sectional view schematically showing the photovoltaic module according to a fifth embodiment of the present invention. The module 1 shown in FIG. 7 is constructed in almost the same manner as the module 1 shown in FIG. 4 except that the interlayer 5 is provided with a surface-textured structure.

As shown in FIG. 7, although the third separation groove 24 is interposed between the first separation groove 21 and the connection groove 23, this third separation groove 24 may be disposed in a manner that the first separation groove 21 is interposed between the third separation groove 24 and the connection groove 23. However, when the third separation groove 24 is interposed between the first separation groove 21 and the connection groove 23 as shown in FIG. 7, the effective area useful for the generation of power can be easily enlarged.

The aforementioned module 1 according to this embodiment can be manufactured by the method explained as follows.

First of all, a transparent front electrode 3 is formed as a continuous film on one of main surfaces of the transparent substrate 2. Then, the first separation groove 21 is formed in the front electrode 3 by means of a laser-scribing using YAG laser to divide the front electrode 3 correspondently with each of the cells 10.

Then, the photovoltaic layer 4a is formed as a continuous film on the front electrode 3. As a result of the formation of the photovoltaic layer 4a, the first separation groove 21 that has been formed in the front electrode 3 is concurrently filled with the amorphous material constituting the photovoltaic layer 4a. Then, the interlayer 5 is formed as a continuous film on the photovoltaic layer 4a. Thereafter, by means of a laser-scribing using YAG laser, the third separation groove 24 is formed to divide the photovoltaic layer 4a and the interlayer 5. These steps are the same as explained in the second embodiment.

Further, due to the a laser-scribing of the photovoltaic layer 4a and the interlayer 5, conductive fine particles are permitted to adhere onto the sidewall and bottom of the third separation groove 24. These conductive fine particles are subsequently removed by means of etching method in this embodiment.

Figure 8A:
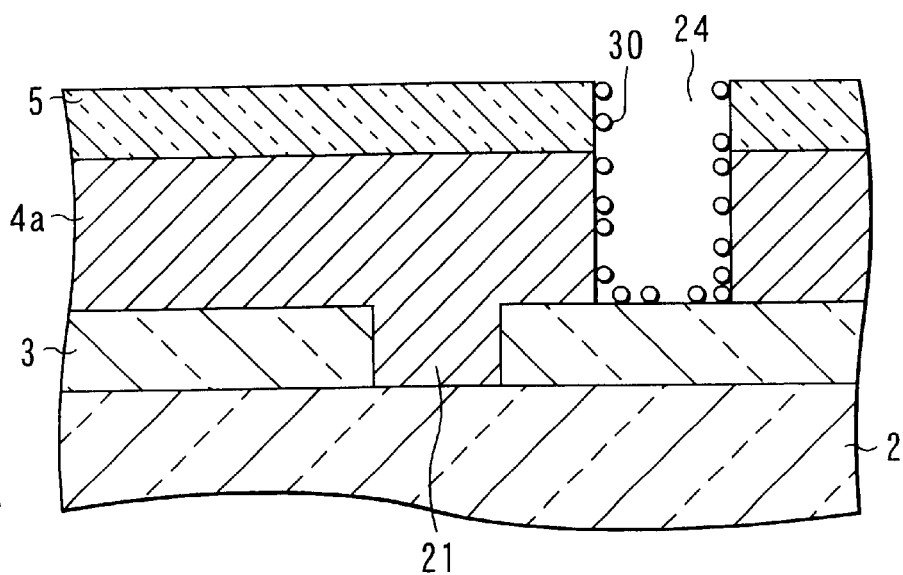
FIGS. 8A and 8B are cross-sectional views schematically showing the third separation groove and the interlayer before and after an etching treatment, respectively.
Figure 8B:
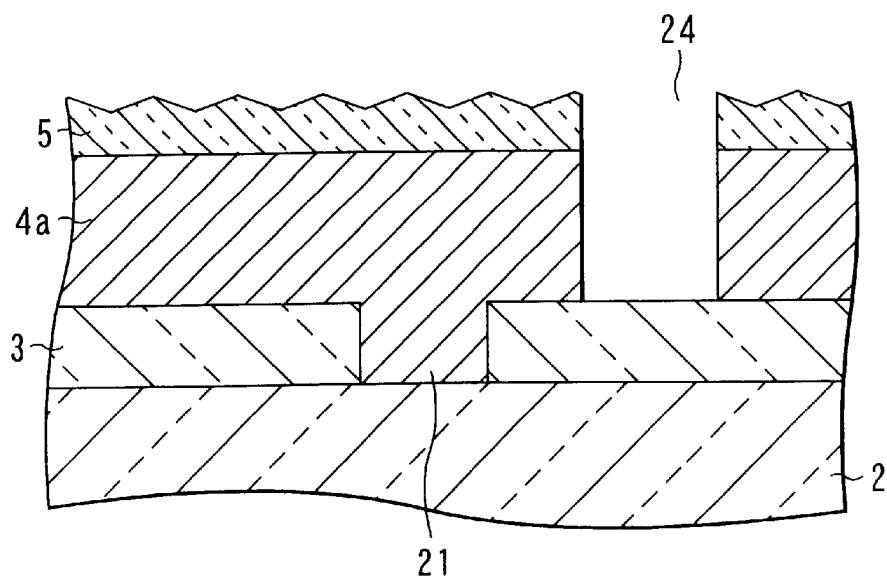

FIGS. 8A and 8B are cross-sectional views schematically showing the third separation groove 24 and the interlayer 5 before and after the etching treatment, respectively. As shown in FIG. 8A, at the moment immediately after the formation of the third separation groove 24, the conductive fine particles 30 are adhered onto the sidewall and bottom of the third separation groove 24. If the second photovoltaic layer 4b is formed under this condition, the third separation groove 24 will be filled with a crystalline material, and hence the insulation between the conductive fine particles 30 would become incomplete. As a result, a conductive path extending from the interlayer or the p-type or the intrinsic semiconductor layer of the second photovoltaic layer 4b of the left side via the left side sidewall of the third separation groove 24 to the right side transparent electrode 3 (as viewed in these drawings) will be formed. If so, it would be impossible of course to effectively take up the electric power that has been generated in the second photovoltaic layer 4b.

Whereas, in this embodiment, since the surface of the structure in which the interlayer 5 is provided is subjected to etching prior to the formation of the second photovoltaic layer 4b, the conductive fine particles 30 can be removed from the sidewall and bottom of the third separation groove 24 as shown in FIG. 8B. As a result, it is now possible according to this embodiment to prevent the formation of the aforementioned conductive path and to effectively take up the electric power that has been generated in the second photovoltaic layer 4b.

Further, if the etching is performed in this manner, the surface of the interlayer 5 would be roughened to form so-called "surface-textured structure" or a "textured pattern" on the surface of the interlayer 5. This surface-textured structure is capable of providing the interface between the interlayer 5 and the photovoltaic layer 4b with a large number of arrayed reflective surfaces each inclined at an acute angle with respect to the surface of substrate, thereby enabling the light that has been entered into the photovoltaic layer 4b to be effectively confined therein. Therefore, it is possible, according to this embodiment, to improve the output performance of the second photovoltaic layer 4b.

It would be preferable to employ an etching solution having a pH ranging from 4 to 10 in the aforementioned etching process. Because if the pH is less than 4 or higher than 10, the etching rate of the interlayer 5 would become excessively high, thereby making it difficult to control the thickness of the interlayer 5.

As for the etching solution, it is possible to employ an acid such as hydrochloric acid, nitric acid and sulfuric acid; or an alkali such as an NaOH solution. It is also possible to employ water in this case, because water is capable of dissolving therein carbon dioxide in air atmosphere to thereby form carbonic acid.

Preferably, the etching treatment to the surface of the structure in which the interlayer 5 is provided should be performed using the aforementioned etching solution while applying thereto an ultrasonic vibration. If the etching is performed in this manner, the removal of the conductive fine particles 30 and the formation of the surface-textured structure can be accomplished within an etching time of several to several tens seconds in general.

Upon finishing the aforementioned etching treatment, the surface having the interlayer 5 is allowed to dry, and the photovoltaic layer 4b is deposited as a continuous film on the surface of the interlayer 5. As a result of the deposition of this photovoltaic layer 4b, the third separation groove 24 is concurrently filled with the crystalline material constituting this photovoltaic layer 4b.

Subsequently, the connection groove 23 passing through the photovoltaic layers 4a and 4b and through the interlayer 5 is formed by means of a laser-scribing using YAG laser, etc. Then, the back electrode 6 is formed on the photovoltaic layer 4b. As a result of the formation of this back electrode 6, the connection groove 23 is concurrently filled with a conductive material, thereby permitting the back electrode 6 to be electrically connected with the front electrode 3 via the conductive material filling the connection groove 23. Then, the second separation groove 22 is formed in the photovoltaic layers 4a and 4b, the interlayer 5, and the back electrode 6 by means of a laser-scribing using YAG laser, etc.

Upon finishing the formation of this second separation groove 22, an etching treatment similar to that applied to the third separation groove 24 should preferably be applied to the structure obtained. When this second separation groove 22 is formed as described above, conductive fine particles are permitted to adhere onto the inner wall as well as onto the bottom surface of this second separation groove 22 in the same manner as explained with reference to the third separation groove 24. However, by contrast to the third separation groove 24, there is little possibility that the second separation groove 22 is filled with a highly conductive material, thereby making it relatively difficult to allow the side leak originating from the conductive fine particles to take place. However, when the aforementioned etching is performed upon finishing the formation of this second separation groove 22, it would become possible to reliably realize sufficiently high output performance.

Upon finishing the aforementioned etching treatment, the resultant surface is allowed to dry. Then, a power-generating region is delimited by means of a laser-scribing using YAG laser, etc. Further, a pair of bus bar electrodes 12 are attached to the both sides of the array constituted by the cells 10, thus obtaining the structure as shown in FIG. 7.

As explained above, according to the method of this embodiment, it is possible, by way of very simple etching process, to easily and reliably remove the conductive fine particles 30 from the sidewall and bottom of the separation groove 24, and at the same time, to roughen the surface of the interlayer 5 so as to obtain a surface-textured structure. Therefore, according to this embodiment, it is possible to easily realize high output performance of module.

Next, a sixth embodiment of the present invention will be explained.

The present inventors have investigated as for the reasons which make it difficult to realize high output performance when the structures shown in FIGS. 3A and 3B are applied to the hybrid-type module. Namely, the present inventors have investigated with regard to the reasons why the effects to be obtained when the aforementioned separation groove is formed in the interlayer differ greatly between the tandem-type structure where each of the photovoltaic layers includes an amorphous semiconductor layer and the hybrid-type structure. As a result, the following fact is found to be also one of the main reasons.

Generally, in the manufacture of tandem-type photovoltaic module, laser is employed for forming the connection groove thereof. For instance, on the occasion of forming the connection groove, a laser beam is scanned from the substrate side onto a laminate structure of the first photovoltaic layer, an interlayer and a second photovoltaic layer which is formed on the surface of transparent substrate where the front electrode thereof is formed in advance. In this case, the laser beam can be hardly absorbed by the front electrode and the interlayer, but can be mainly absorbed by the first and second photovoltaic layers. As a result, the first and second photovoltaic layers will be selectively fused or sublimed at the laser beam-irradiated portion thereof. Further, the portion of the interlayer which corresponds to the laser beam-irradiated portion is eliminated due to the heat and/or kinetic energy generated as a result of the fusion or sublimation of the underlying first photovoltaic layer. In this manner, the connection groove dividing the laminate structure of the first photovoltaic layer, the interlayer and the second photovoltaic layer will be formed.

It is important in this method to enable both of the first and second photovoltaic layers to be suitably fused or sublimed. In the ordinary tandem-type structure, an amorphous semiconductor layer which is capable of exhibiting a high light-absorption coefficient to the laser beam such as an amorphous silicon layer is employed, so that the connection groove could be formed using a relatively low laser power.

However, a crystalline semiconductor layer such as a crystalline silicon layer is very low in light-absorption coefficient as compared with an amorphous semiconductor layer such as an amorphous silicon layer. Therefore, it is difficult, in the manufacture of the hybrid-type photovoltaic module, to sufficiently fuse or sublime the second photovoltaic layer by making use of the aforementioned low laser power. Therefore, it is required to enhance the laser power. However, if the laser power is enhanced, the front electrode, etc. would be damaged. This is the fourth reason.

By taking the aforementioned factors into consideration, the present inventors have made an intensive study with respect to the structure of the hybrid-type photovoltaic module. As a result, the present inventors has found that, when the separation groove dividing the front electrode and the separation groove disposed for preventing the side leak and dividing both of the first photovoltaic layer and the interlayer are joined to form the first separation groove, the ratio of the amorphous phase occupying the interior of the first separation groove is very high in spite of the fact that the semiconductor layer in the second photovoltaic layer is crystalline. It is also found out that this amorphous phase is not confined to the interior of the first separation groove but is spread out to an upper portion of the first separation groove of the second photovoltaic layer as well as up to a peripheral region thereof.

Further, the present inventors have noticed that according to the prior art, the first separation groove is spaced apart from the connection groove. As a result, present inventors has found that, if the connection groove is formed in such a way that the connection groove borders on the first separation groove, the irradiation of laser beam for forming the connection groove can be performed against the portion of the second photovoltaic layer where the ratio of amorphous phase is high, thereby enabling the second photovoltaic layer to be sufficiently fused or sublimed using such a relatively low laser power that would not give any substantial damage to the front electrode, etc., and additionally enabling the area of module useful for the power generation to be further increased.

Figure 9:
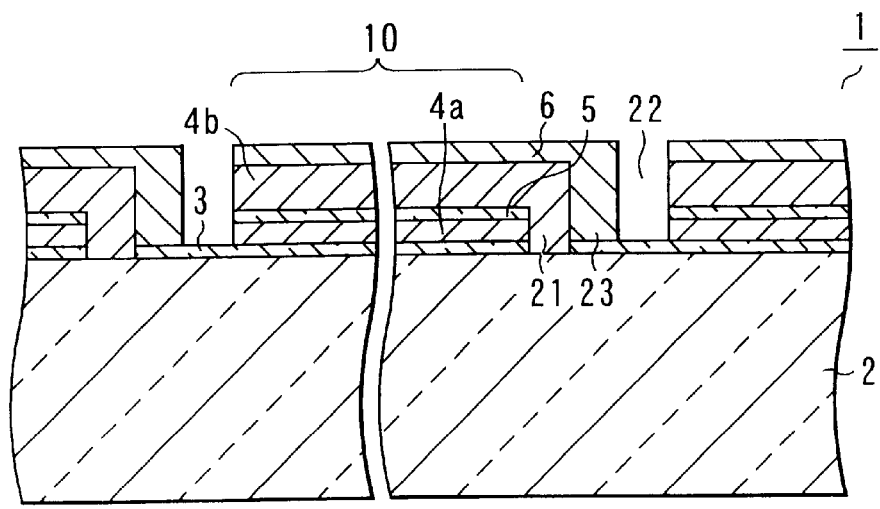
FIG. 9 is a cross-sectional view schematically showing the photovoltaic module according to a sixth embodiment of the present invention.

FIG. 9 a cross-sectional view schematically showing the photovoltaic module according to a sixth embodiment of the present invention. The module 1 shown in FIG. 9 is constructed in almost the same manner as the module 1 shown in FIG. 4 except that the first separation groove 21 divides not only the front electrode 3 but also the first photovoltaic layer 4a and the interlayer 5. Namely, in the module 1 shown in FIG. 9, the first separation groove 21 thereof functions not only as the first separation groove 21 but also as the third separation groove 23 of the module 1 shown in FIG. 4. Further, according to the module 1 shown in FIG. 9, the connection groove 23 borders on the first separation groove 21 and also on the second separation groove 22. Although the connection groove 23 borders on the second separation groove 22 in the embodiment shown in FIG. 9, these grooves may be spaced apart from each other.

The module 1 according to this embodiment can be manufactured by the method as explained below with reference to FIGS. 10A to 10G. Namely, FIGS. 10A to 10G are cross-sectional views schematically showing the method of manufacturing the photovoltaic module according to a sixth embodiment of the present invention.

Figure 10A:
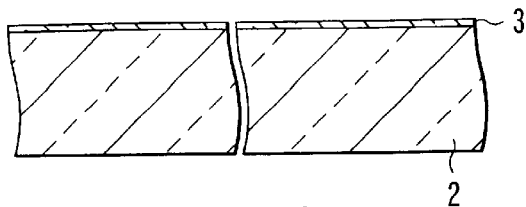
FIGS. 10A to 10G are cross-sectional views schematically showing the method of manufacturing the photovoltaic module according to a sixth embodiment of the present invention.
Figure 10B:
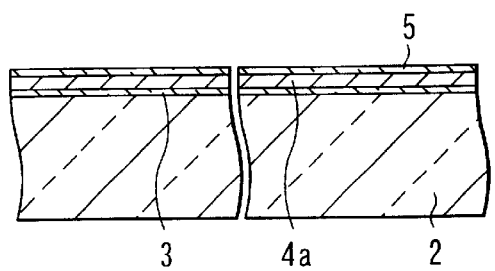
Figure 10C:
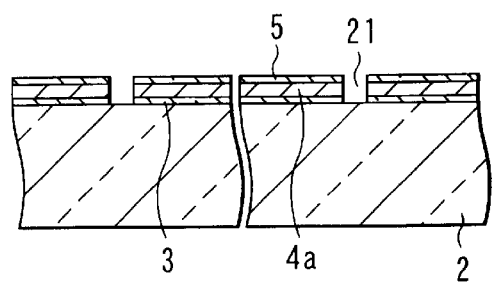
Figure 10D:
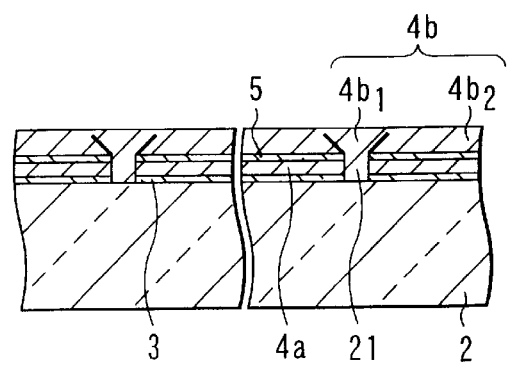
Figure 10E:
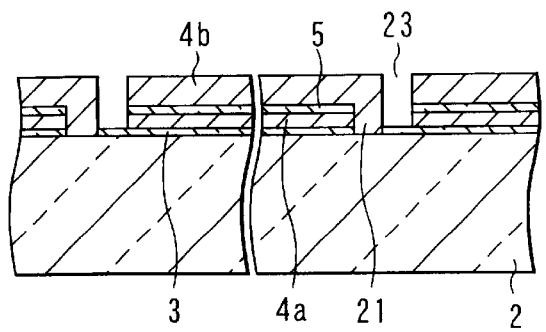
Figure 10F:
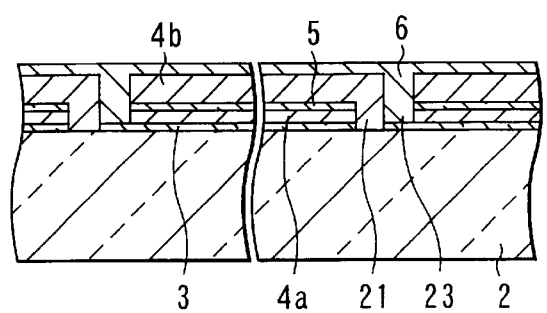
Figure 10G:
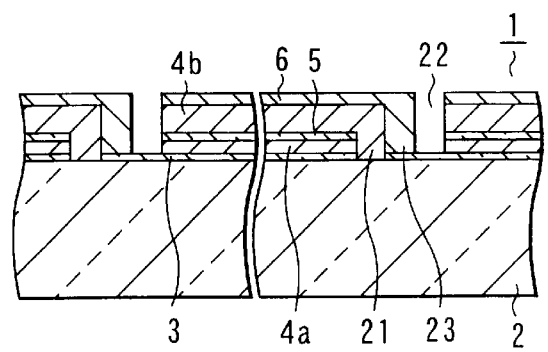

For the manufacture of the module 1 shown in FIG. 10G, at first, prepared is a transparent substrate 2 on one main surface of which is provided with a transparent front electrode 3 in a form of a continuous film as shown in FIG. 10A. Then, as shown in FIG. 10B, a photovoltaic layer 4a and an interlayer are successively deposited as a continuous film respectively on the surface of the front electrode 3.

Then, as shown in FIG. 10C, a first laminate structure including the front electrode 3, the photovoltaic layer 4a and the interlayer 5 is divided by means of a laser-scribing using YAG laser, etc. As a result, the first laminate structure divided by the first separation groove 21 will be obtained. By the way, the electrically conductive fine particles to be produced as a result of the laser-scribing of the interlayer 5 are removed as required by means of ultrasonic cleaning, etc.

Then, as shown in FIG. 10D, the photovoltaic layer 4b is formed as a continuous film on the interlayer 5. As a result of the formation of the photovoltaic layer 4b, the first separation groove 21 is concurrently filled with the material constituting the photovoltaic layer 4b.

Generally, since the interlayer 5 is formed of a crystalline material, the semiconductor layer of photovoltaic layer 4b to be deposited on the interlayer 5 can be made crystalline. However, because of the reason that the transparent substrate 2 is amorphous, it would be generally difficult to enable a crystal growth to take place inside the first separation groove 21. Therefore, the ratio of amorphous phase in the material filling the first separation groove 21 would be naturally increased, and at the same time, the ratio of amorphous phase at and near the region over the separation groove 21 of the photovoltaic layer 4b would be increased. Accordingly, the photovoltaic layer 4b would be constituted by an amorphous portion $4b_1$ which contains a relatively high ratio of amorphous phase, and by crystalline portion $4b_2$ which is formed substantially only of crystalline phase.

By the way, a portion of the photovoltaic layer 4b which is disposed at the regions inside and periphery of the separation groove 21 is caused to peel off along with the photovoltaic layer 4a and the interlayer 5 during the process of forming the photovoltaic layer 4b or during the post process thereof. The peeling of this kind can be prevented by suitably adjusting the deposition conditions.

Thereafter, as shown in FIG. 10E, by means of a laser-scribing using YAG laser, etc., the connection groove 23 is formed in a second laminate structure including the photovoltaic layer 4a, the interlayer 5 and the photovoltaic layer 4b. According to this embodiment, since the connection groove 23 borders on the first separation groove 21, the laser beam irradiation for forming the connection groove 23 can be selectively applied to the amorphous portion $4b_1$ exhibiting a far higher light-absorption coefficient as compared with the crystalline portion $4b_2$. Therefore, the connection groove 23 can be formed using such a low laser power that would not give any substantial damage to the transparent front electrode 3, etc.

Then, as shown in FIG. 10F, a back electrode 6 is formed on the photovoltaic layer 4b. As a result of the formation of this back electrode 6, the connection groove 23 is concurrently filled with a conductive material such as metal, thereby electrically connecting the back electrode 6 with the front electrode 3 via the conductive material filling the connection groove 23.

Then, as shown in FIG. 10G, by means of a laser-scribing using YAG laser, etc., the second separation groove 22 is formed in a third laminate structure including the photovoltaic layer 4a, the interlayer 5, the photovoltaic layer 4b and the back electrode 6. Then, a power-generating region is delimited by means of a laser-scribing using YAG laser, etc. Further, a pair of bus bar electrodes 12 are attached to the both sides of the array constituted by the cells 10, thus obtaining the structure as shown in FIGS. 9 and 10G.

As explained above, in the module according to this embodiment, the interlayer 5 is electrically insulated from the conductive material filling the connection groove 23 by the separation groove 21. Therefore, the generation of leak current between these regions can be prevented. According to this embodiment, since the connection groove 23 borders on the first separation groove 21, the laser beam irradiation for forming the connection groove 23 can be selectively applied to the amorphous portion 4b1 exhibiting a far higher photo-absorption coefficient as compared with the crystalline portion 4b2. Therefore, the connection groove 23 can be formed using such a low laser power that would not give any substantial damage to the transparent front electrode 3, etc. Further, according to this embodiment, since the connection groove 23 borders on the first separation groove 21, the area of module useful for the power generation can be further increased.

According to the embodiment described above, the dividing of the front electrode 3 and the dividing of the photovoltaic layer 4a and the interlayer 5 are concurrently performed in the same single step. However, these division may be performed separately. Further, according to the embodiment described above, the connection groove 23 borders on the second separation groove 22. However, these grooves may be spaced apart from each other. However, when the connection groove 23 borders on the second separation groove 22, the area useful for the power generation can be increased, thereby making it advantageous in this respect.

Figure 11A:
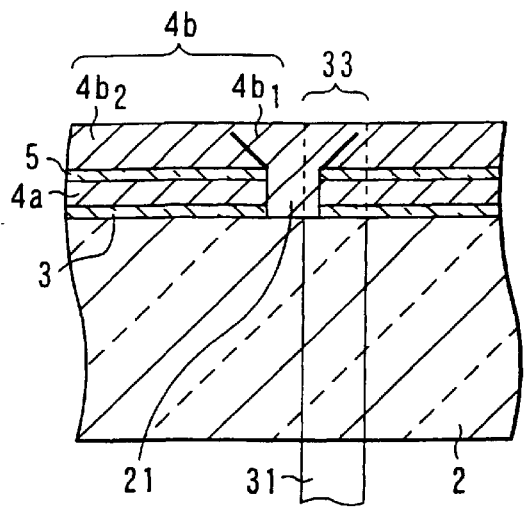
FIG. 11A is a cross-sectional view schematically showing one example of the manufacturing method of the connection groove of the photovoltaic module shown in FIGS. 9 and 10G.
Figure 11B:
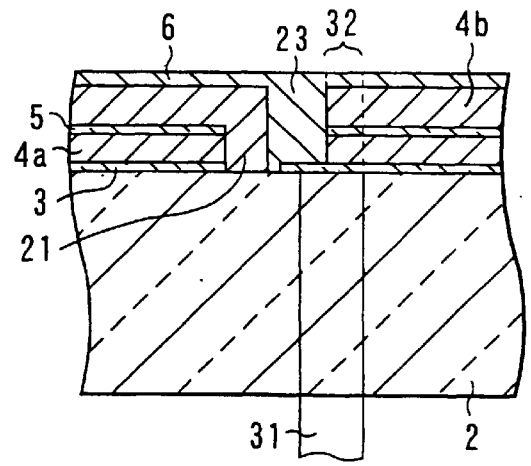
FIG. 11B is a cross-sectional view schematically showing one example of the method of forming a second separation groove of the photovoltaic module shown in FIGS. 9 and 10G.

Preferably, the formation of the second separation groove 22 and the connection groove 23 should be performed by the method shown in FIGS. 11A and 11B.

Figure 12:
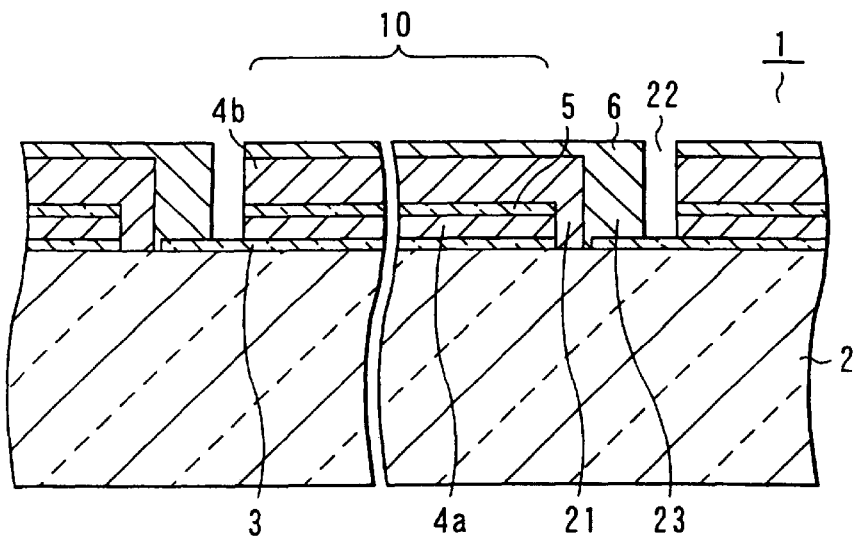
FIG. 12 is a cross-sectional view schematically showing the photovoltaic module to be obtained by the method illustrated in FIGS. 11A and 11B.

FIG. 11A is a cross-sectional view schematically showing one example of the forming method of the connection groove 23 of the photovoltaic module 1 shown in FIGS. 9 and 10G. FIG. 11B is a cross-sectional view schematically showing one example of the method of forming a second separation groove 22 of the photovoltaic module 1 shown in FIGS. 9 and 10G. FIG. 12 is a cross-sectional view schematically showing the photovoltaic module to be obtained by the method illustrated in FIGS. 11A and 11B. The reference numeral 33 in FIG. 11A represents a region where the connection groove 23 is to be formed, while the reference numeral 32 in FIG. 11B represents a region where the second separation groove 22 is to be formed.

The connection groove 23 may be formed in such a manner that as shown in FIG. 11A, the scanning of laser beam 31 is performed so as to enable the beam spot of laser beam 31 to lie across one of the sidewalls of the first separation groove 21. If the scanning of laser beam is performed in this manner, even if the relative position of the center of laser beam 31 to the first separation groove 21 is caused to fluctuate more or less in the lateral direction in the drawing, the connection groove 23 can be reliably formed without leaving a residual matter at a region between the first separation groove 21 and the connection groove 23. By the way, when the connection groove 23 is formed in this manner, the first separation groove 21 is caused to overlap with the connection groove 23 as shown in FIG. 11B. Therefore, the module to be obtained in this manner would be constructed such that a portion of the bottom of the connection groove 23 is constituted by the surface of the transparent substrate 2 while the rest of the bottom of the connection groove 23 is constituted by the surface of the front electrode 3 as shown in FIG. 12.

Similarly, the second separation groove 22 may be formed in such a manner that as shown in FIG. 11B, the scanning of laser beam 31 is performed so as to enable the beam spot of laser beam 31 to lie across one of the sidewalls of the connection groove 23 (i.e. the sidewall located remote from the first separation groove 21). If the scanning of laser beam is performed in this manner, even if the relative position of the center of laser beam 31 to the connection groove 23 is caused to fluctuate more or less in the lateral direction in the drawing, the second separation groove 22 can be reliably formed without leaving a residual matter at a region between the second separation groove 22 and the connection groove 23. Furthermore, when the second separation groove 22 is formed in this manner, the second separation groove 22 is disposed bordering on the connection groove 23 as shown in FIG. 12, so that the area which is useful for the generation of electric power can be advantageously increased.

By the way, as for the laser to be employed for forming the separation groove or the connection groove, a pulse laser is generally employed, so that the adjustment of the power of the laser beam 31 can be performed by changing the cycle of pulse. Therefore, when the second separation groove 22 is to be formed, a portion of the beam spot is required to be partially superimposed on the position of the beam spot of one cycle before.

However, when the power of laser beam 31 is lowered in order to prevent the front electrode 3 from being damaged on the occasion of forming the second separation groove 22, the cycle of pulse would be enlarged, and hence, merely an array of plural number of holes would be formed without forming the second separation groove 22 in an extreme case. Further, even if it is possible to form the second separation groove 22, it may become difficult to realize such a sufficient insulating/separating property as expected.

Whereas, when the scanning of laser beam 31 is performed as shown in FIG. 11B on the occasion of forming the second separation groove 22, part of the laser beam 31 would be used to irradiate the metallic material filling the connection groove 23. The metallic material filled in the connection groove 23 reflects part of the laser beam 31 and also mediates the heat conduction between the photovoltaic layers 4a and 4b, as well as the heat conduction between any of the photovoltaic layers 4a and 4b and the back electrode 6. Accordingly, even if the power of the laser beam 31 is high, it is possible to realize a uniform heating while preventing the front electrode, etc. from being damaged. Namely, the second separation groove 22 which is excellent in insulating/isolating property can be reliably formed.

In this sixth embodiment, the specific resistance and thickness of the interlayer 5 should preferably be selected from those described with reference to the first embodiment. Namely, the specific resistance of the interlayer 5 should preferably be confined within the range of $1.0 \times 10^{-3}$ $\Omega \cdot cm$ to $1.0 \times 10^{-1}$ $\Omega \cdot cm$, preferably within the range of $1.0 \times 10^{-3}$ $\Omega \cdot cm$ to $1 \times 10^{-2}$ $\Omega \cdot cm$. Further, this thickness of the photovoltaic layers 4a and 4b should preferably be selected also from those described with reference to the first embodiment. When the thickness of the photovoltaic layers 4a and 4b is confined as mentioned above, it becomes possible to easily well-balance the output current of the photovoltaic layer 4a with the output current of the photovoltaic layer 4b, while making it possible to further enhance the effect of suppressing the generation of leak current.

The techniques illustrated in the aforementioned first through sixth embodiments may be optionally combined. For example, the technique of the first embodiment may be combined with any of the techniques of the aforementioned second to sixth embodiments. Further, the technique of the fifth embodiment may be combined with any of the techniques of the aforementioned second to fourth embodiments and sixth embodiment.

Next, specific examples of the present invention will be explained.

EXAMPLE 1

By the following method, the photovoltaic module 1 shown in FIGS. 1 and 2 was manufactured.

First of all, a glass substrate of 100 mm×30 mm in size whose main surface is provided with an $SnO_2$ film 3 was prepared. Then, with use of YAG pulse laser, a laser-scribing of the $SnO_2$ film 3 was performed by laser-scanning parallel with one edge of the substrate 2, thereby forming separation grooves 21 which divide the $SnO_2$ film 3 into a plurality of stripe-like patterns. Then, by means of plasma CVD method, a photovoltaic layer 4a having a thickness of 0.2 μm was deposited on the $SnO_2$ film 3. This photovoltaic layer 4a had a p-i-n junction, and a non-doped amorphous silicon layer was included therein as a semiconductor layer.

Then, a ZnO layer 5 having a thickness of 50 nm and containing Al at a concentration of 2% was deposited on the surface of the photovoltaic layer 4a by means of sputtering method under the conditions of: 150° C. in temperature, 0.53 Pa (4 mTorr) in pressure, and 20 sccm in Ar flow rate. By the way, in this example, the ZnO layer 5 was further doped with 0.1% in concentration of Ga in addition to Al. The specific resistance of this ZnO layer 5 thus formed was $3\times10^{-2}$ Ω·cm.

Subsequently, by means of plasma CVD method, a photovoltaic layer 4b having a thickness of 3.0 μm was formed on the surface of the ZnO layer 5. This photovoltaic layer 4b included a non-doped polycrystalline silicon layer as an intrinsic semiconductor layer.

Then, with use of YAG SHG pulse laser, a laser-scribing of a laminate structure including the photovoltaic layers 4a, 4b and the ZnO layer 5 was performed by laser-scanning parallel with one edge of the substrate 2, thereby forming connection grooves 23 dividing this laminate structure into a plurality of stripe-like patterns.

Thereafter, by means of sputtering method, a ZnO film and an Ag film were successively deposited on the surface of the photovoltaic layer 4b to form a back electrode 6. Then, with use of YAG SHG pulse laser, a laser-scribing of a laminate structure including the photovoltaic layers 4a and 4b, the ZnO layer 5 and the back electrode 6 was performed by laser-scanning parallel with one edge of the substrate 2, thereby forming a separation groove 22 dividing the laminate structure into a plurality of stripe-like patterns.

Then, a laser scanning along the periphery of the substrate 2 was performed with use of YAG pulse laser, thereby forming a groove in a laminate structure of the $SnO_2$ film 3, the photovoltaic layers 4a and 4b, the ZnO layer 5 and the back electrode 6, so as to delimit the power generation region. As a result, ten columns of photovoltaic cells 10 each having a width of about 10 mm and length of about 30 mm and connected in series with each other were formed. Further, a pair of bus bar electrodes 12 were attached to both ends of series array 11 constituted by the cells 10, thereby obtaining the module 1 as shown in FIGS. 1 and 2.

Then, the output performance of this module 1 was investigated at a measuring temperature of 25° C. by utilizing a solar simulator in which an irradiance was set at 100 mW/cm$^2$ and a spectrum was set at AM 1.5. By the way, as for the light source, a combination of a xenon lamp, a halogen lamp and a filter was employed. As a result, an open-circuit voltage of 1.310V, a short-circuit current density of 12.4 mA/cm$^2$, a fill factor of 68.4%, and a power generation efficiency of 11.1% were obtained in each cell 10 of this module 1.

EXAMPLE 2

A photovoltaic module 1 as shown in FIGS. 1 and 2 was manufactured in the same manner as explained in Example 1 except that oxygen was added into the Ar gas flow at a concentration of several % on the occasion of forming the ZnO film 5 and the ZnO film 5 was not doped with Ga. The module 1 thus obtained was featured in that the ZnO film 5 thereof contained a higher concentration of oxygen as compared with the module 1 of Example 1. Further, according to the module 1 of this example, the ZnO film 5 contained Al at a concentration of 2%, and the specific resistance thereof was $1\times10^{-3}$ Ω·cm.

Then, the output performance of this module 1 was investigated under the same conditions as explained in Example 1. As a result, an open-circuit voltage of 1.290V, a short-circuit current per unit area of 12.1 mA/cm$^2$, a fill factor of 64.9%, and a power generation efficiency of 10.1% were obtained in each cell 10 of this module 1.

EXAMPLE 3

A photovoltaic module 1 as shown in FIGS. 1 and 2 was manufactured in the same manner as explained in Example 1 except that oxygen was added into the Ar gas flow at a concentration of several % on the occasion of forming the ZnO film 5. The module 1 thus obtained was featured in that the ZnO film 5 thereof contained a higher concentration of oxygen as compared with the module 1 of Example 1. Further, according to the module 1 of this example, the ZnO film 5 contained Al at a concentration of 2% and Ga at a concentration of 0.1% and the specific resistance thereof was $9\times10^{-2}$ Ω·cm.

Then, the output performance of this module 1 was investigated under the same conditions as explained in Example 1. As a result, an open-circuit voltage of 1.320V, a short-circuit current per unit area of 12.5 mA/cm$^2$, a fill factor of 66.3%, and a power generation efficiency of 10.9% were obtained in each cell 10 of this module 1.

COMPARATIVE EXAMPLE 1

A photovoltaic module 1 as shown in FIGS. 1 and 2 was manufactured in the same manner as explained in Example 1 except that the ZnO film 5 was not doped with Ga. The concentration of oxygen in the ZnO film 5 of this module 1 was almost the same as that of the module 1 of Example 1. Further, according to the module 1 of this comparative example, the ZnO film 5 contained Al at a concentration of 2%, and the specific resistance thereof was found $4\times10^{-4}$ Ω·cm.

The specific resistance of the ZnO film 5 of the module 1 according to Examples 1 to 3 and to Comparative Example 1, as well as the output performance of the module 1 are summarized in the following Table 1.

TABLE 1

|  | Specific resistance (Ω · cm) | Output performance | | | |
|---|---|---|---|---|---|
|  |  | $V_{OC}$ (V) | $J_{SC}$ (mA/cm$^2$) | F.F. (%) | Eff. (%) |
| Example 1 | $3\times10^{-2}$ | 1.310 | 12.4 | 68.4 | 11.1 |
| Example 2 | $1\times10^{-3}$ | 1.290 | 12.1 | 64.9 | 10.1 |
| Example 3 | $9\times10^{-2}$ | 1.320 | 12.5 | 66.3 | 10.9 |
| Comparative example 1 | $4\times10^{-4}$ | 1.260 | 12.1 | 60.8 | 9.3 |

In the above Table 1, "$V_{oc}$" denotes the open-circuit voltage, and "$J_{sc}$" a short-circuit current per unit area. Further, "F.F." denotes a fill factor, and "Eff" a conversion efficiency.

As apparent from Table 1, when the specific resistance of ZnO film 5 was equal to or higher than $1\times10^{-3}$ Ω·cm, it was possible to realize a higher power generation efficiency. Further, when the specific resistance of ZnO film 5 was equal to or higher than $1\times10^{-2}$ Ω·cm, it was possible to realize a much higher conversion efficiency.

It would be clear through the comparison of Examples 1 and 2 with Comparative Example 1 that as the specific resistance of ZnO film 5 was increased, the conversion efficiency was proportionally improved. Whereas, it is clear from the comparison between Example 1 and Example 3 that as the specific resistance of ZnO film 5 was increased, the conversion efficiency was proportionally deteriorated. These results indicate that the generation of leak current can be suppressed by increasing the specific resistance of ZnO film 5, and that if the specific resistance of ZnO film 5 becomes excessively high, the electric connection between photovoltaic layers 4a and 4b would be obstructed. By the way, as long as the specific resistance of ZnO film 5 is equal to or lower than $1\times10^{-1}$ Ω·cm, it was possible to prevent the electric connection between photovoltaic layers 4a and 4b from being badly obstructed.

Next, a plurality of photovoltaic modules 1 differing in the thickness of ZnO film 5 from each other were manufactured in the same manner as explained in Example 1 except that the thickness of ZnO film 5 was altered. Further, a plurality of photovoltaic modules 1 differing in the thickness of ZnO film 5 from each other were manufactured in the same manner as explained in Example 2 except that the thickness of ZnO film 5 was altered. Additionally, a plurality of photovoltaic modules 1 differing in the thickness of ZnO film 5 from each other were manufactured in the same manner as explained in Example 3 except that the thickness of ZnO film 5 was altered. Furthermore, a plurality of photovoltaic modules 1 differing in the thickness of ZnO film 5 from each other were manufactured in the same manner as explained in Comparative Example 1 except that the thickness of ZnO film 5 was altered.

Then, the relationship between the specific resistance and the output performance of the ZnO film 5 was investigated on these modules 1. As a result, in any of these modules, when the thickness of ZnO film 5 was exceeded over 100 nm, the short-circuit current per unit area was caused to deteriorate badly. It is assumed that the reason for this attributes to the fact that when the thickness of ZnO film 5 became excessively large, the magnitude of light passing through the ZnO film 5 was caused to decrease, thereby lowering the output current of the photovoltaic layer 4b. By the way, it was confirmed that when the ZnO film 5 was formed by the methods of Examples 1 to 3, the short-circuit current per unit area could be made sufficiently high as long as the thickness of the ZnO film 5 was confined to a value equal to or lower than 100 nm, or made much higher as long as the thickness of the ZnO film 5 was confined to a value equal to or lower than 70 nm.

On the other hand, when the thickness of the ZnO film 5 was made less than 5 nm in the modules 1 wherein the ZnO film 5 was deposited by the methods of Examples 1 to 3, the short-circuit current per unit area thereof was found slightly higher than the module 1 of Comparative Example 1, but other output performance thereof were found almost equivalent to the module 1 of Comparative Example 1. This can be attributed to the facts that when the thickness of the ZnO film 5 is made thinner, the generation of leak current can be proportionally suppressed, and that if the thickness of the ZnO film 5 is made excessively thinner, the magnitude of light to be reflected by the ZnO film 5 decreases, thereby lowering the output current of the photovoltaic layer 4a. By the way, when the ZnO film 5 was deposited to a thickness of 10 nm or more by the methods of Examples 1 to 3, the output performance of module could be prominently improved as compared with the module wherein the ZnO film 5 was formed by the method of Comparative Example 1. This effect could be made much prominent when the thickness of ZnO film 5 was increased to 20 nm or more.

EXAMPLE 4

By the following method, the photovoltaic module 1 shown in FIGS. 1 and 4 was manufactured.

First of all, a glass substrate of 127 mm×127 mm in size whose main surface was provided with an $SnO_2$ film 3 was prepared. Then, with use of YAG IR pulse laser, a laser-scribing of the $SnO_2$ film 3 was performed by laser-scanning parallel with one edge of the substrate 2, thereby forming separation grooves 21 each having a width of 40 $\mu$m and dividing the $SnO_2$ film 3 into a plurality of stripe-like patterns.

Subsequently, the resultant structure was subjected to ultrasonic cleaning and drying processes. Further, by means of plasma CVD method, a photovoltaic layer 4a was formed on the surface of the $SnO_2$ film 3. By the way, this photovoltaic layer 4a had a p-i-n junction, and a non-doped amorphous silicon layer was included therein as a semiconductor layer. Then, a ZnO layer 5 was deposited on the surface of the photovoltaic layer 4a by means of sputtering method.

Then, with use of YAG SHG pulse laser, a laser-scribing of the photovoltaic layer 4a and the ZnO layer 5 was performed by laser-scanning parallel with one edge of the substrate 2, thereby forming separation grooves 24 each having a width of 60 $\mu$m and dividing these layers into a plurality of stripe-like patterns. By the way, the center-to-center distance between these separation grooves 21 and 24 was set to 100 $\mu$m.

Thereafter, by means of plasma CVD method, a photovoltaic layer 4b was formed on the ZnO film 5. By the way, this photovoltaic layer 4b included a non-doped polycrystalline silicon layer as a semiconductor layer.

Then, with use of YAG SHG pulse laser, a laser-scribing of the photovoltaic layers 4a and 4b and the ZnO layer 5 was performed by laser-scanning parallel with one edge of the substrate 2. As a result, connection grooves 23 each having a width of 60 $\mu$m and dividing these layers into a plurality of stripe-like patterns were formed. By the way, the center-to-center distance between the connection groove 23 and the separation groove 24 was set to 100 $\mu$m.

Thereafter, by means of sputtering method, a ZnO film and an Ag film were successively deposited on the surface of the photovoltaic layer 4b to form a back electrode 6. Then, by laser-scanning parallel with one side of the substrate 2 with use of YAG SHG pulse laser, formed were separation grooves 22 each having a width of 60 $\mu$m and dividing a laminate structure, which includes the photovoltaic layers 4a and 4b, the ZnO layer 5 and the back electrode 6, into a plurality of stripe-like patterns. By the way, the center-to-center distance between the separation groove 22 and the connection groove 23 was set to 100 $\mu$m.

Then, by laser-scanning along the periphery of the substrate 2 with use of YAG pulse laser, a groove which divides a laminate structure including the $SnO_2$ film 3, the photovoltaic layers 4a and 4b, the ZnO layer 5 and the back electrode 6 was formed to delimit the power generation region. As a result, eleven columns of photovoltaic cells 10 each having a size of 10 mm×100 mm and connected in series with each other were formed.

Further, a pair of bus bar electrodes 12 were attached to both ends of series array 11 constituted by the cells 10, thereby obtaining the module 1 as shown in FIGS. 1 and 4. By the way, plural kinds of modules 1 differing from each other in thickness of the photovoltaic layers 4a and 4b, and of the ZnO layer 5 were manufactured in this example.

Then, the output performances of these modules 1 manufactured by the aforementioned method were investigated under the same conditions as explained in Example 1. The results obtained are shown at the column of "Example 4" in Table 2.

COMPARATIVE EXAMPLE 2

A photovoltaic module having the same structure as that manufactured in Example 4 except that the separation groove 24 was not provided therewith was manufactured. In this comparative example, the thickness of the photovoltaic layer 4a was set to 250 nm, the thickness of the photovoltaic layer 4b was set to 3000 nm, and the thickness of the ZnO film 5 was set to 30 nm. Then, the output performances of these modules were also investigated. The results obtained are shown at the column of "Comparative Example 2" in Table 2.

TABLE 2

| | Thickness (nm) | | | Output performance | | |
|---|---|---|---|---|---|---|
| | Photovoltaic layer | | ZnO | $V_{OC}$ | $J_{SC}$ | F.F. | Eff. |
| | 4a | 4b | film | (V) | (mA/cm$^2$) | (%) | (%) |
| Example 4 | 200 | 3000 | 30 | 1.312 | 12.3 | 64.2 | 10.4 |
| | 200 | 3000 | 50 | 1.318 | 12.7 | 65.8 | 11.0 |
| | 200 | 3000 | 70 | 1.322 | 12.4 | 67.1 | 11.0 |
| | 250 | 2300 | 30 | 1.359 | 12.3 | 63.5 | 10.6 |
| | 250 | 2300 | 50 | 1.357 | 11.8 | 64.8 | 10.5 |
| | 250 | 2300 | 70 | 1.348 | 11.1 | 66.6 | 10.0 |
| | 250 | 3000 | 30 | 1.351 | 12.0 | 63.8 | 10.3 |
| | 250 | 3000 | 50 | 1.347 | 12.8 | 64.2 | 11.1 |
| | 250 | 3000 | 70 | 1.355 | 12.5 | 65.8 | 11.1 |
| | 250 | 3500 | 30 | 1.351 | 12.4 | 64.2 | 10.8 |
| | 250 | 3500 | 50 | 1.356 | 13.1 | 63.0 | 11.2 |
| | 250 | 3500 | 70 | 1.324 | 12.6 | 65.5 | 10.9 |
| | 300 | 3000 | 30 | 1.322 | 13.0 | 65.2 | 11.2 |
| | 300 | 3000 | 50 | 1.311 | 12.8 | 66.0 | 11.1 |
| | 300 | 3000 | 70 | 1.332 | 12.3 | 65.0 | 10.7 |
| Comparative example 2 | 250 | 3000 | 30 | 1.313 | 12.3 | 50.0 | 8.1 |

As shown in Table 2, all of the modules according to Example 4 exhibited a far excellent power generation efficiency as compared with the module according to Comparative Example 2. This merit may be attributed to the facts that since the separation groove 24 was provided in all of the modules according to Example 4, it was possible to increase the open-circuit voltage and to greatly increase the fill factor, though the short-circuit current per unit area was not substantially changed.

By the way, a photovoltaic module 101 as shown in FIG. 3A was manufactured almost the same method as explained in Example 4, and the output performance of this module 101 were measured. However, when the output performance of this module 101 were compared with those of the module 1 according to Example 4, the output performance of this module 101 were found insufficient in every respects.

EXAMPLE 5

A photovoltaic module 1 as shown in FIG. 5 was manufactured in the same manner as explained in Example 4. Namely, in this example, a separation groove 25 having a width of 40 μm was also formed in addition to the separation groove 21 in the step of forming the separation groove 21. Further, the center-to-center distance between these separation grooves 21 and 24 was set to 100 μm, the center-to-center distance between these separation grooves 24 and 25 was set to 100 μm, the center-to-center distance between the separation groove 25 and the connection groove 23 was set to 100 μm, and the center-to-center distance between the connection groove 23 and the separation groove 22 was set to 100 μm. By the way, plural kinds of modules 1 differing from each other in thickness of the photovoltaic layers 4a and 4b, and of the ZnO layer 5 were manufactured also in this example.

Then, the output performances of these modules were investigated under the same conditions as explained in Example 1. The results obtained are shown in the following Table 3.

TABLE 3

| | Thickness (nm) | | | Output performance | | | |
|---|---|---|---|---|---|---|---|
| | Photovoltaic layer | | ZnO | $V_{OC}$ | $J_{SC}$ | F.F. | Eff. |
| | 4a | 4b | film | (V) | (mA/cm$^2$) | (%) | (%) |
| Example 5 | 250 | 2000 | 30 | 1.351 | 12.2 | 68.0 | 11.2 |
| | 250 | 2000 | 50 | 1.358 | 11.7 | 69.2 | 11.0 |
| | 250 | 2000 | 70 | 1.324 | 10.9 | 70.5 | 10.2 |
| | 250 | 3000 | 30 | 1.352 | 11.6 | 71.2 | 11.1 |
| | 250 | 3000 | 50 | 1.359 | 12.3 | 67.8 | 11.3 |
| | 250 | 3000 | 70 | 1.350 | 12.2 | 66.7 | 11.0 |
| | 250 | 2000 | 30 | 1.351 | 12.2 | 68.0 | 11.2 |
| | 250 | 2000 | 50 | 1.358 | 11.7 | 69.2 | 11.0 |
| | 250 | 2000 | 70 | 1.324 | 10.9 | 70.5 | 10.2 |
| | 300 | 3500 | 30 | 1.362 | 11.84 | 70.51 | 11.4 |
| | 300 | 3500 | 50 | 1.354 | 12.73 | 66.95 | 11.5 |
| | 300 | 3500 | 70 | 1.356 | 12.66 | 66.5 | 11.5 |

As apparent from Tables 2 and 3, all of the modules according to Example 5 exhibited a far excellent power generation efficiency as compared with the module according to Comparative Example 2. This merit may be attributed to the facts that since the separation groove 24 was provided in all of the modules according to Example 5, it was possible to increase the open-circuit voltage and to greatly increase the fill factor, though the short-circuit current per unit area was not substantially changed.

Further, it is clear from the comparison between the data shown in Table 2 and the data shown in Table 3 that the modules according to Example 5 tend to exhibit a higher fill factor than the modules according to Example 4. This merit may be attributed to the fact that since the separation groove 25 was provided in the modules according to Example 5, it was possible to prevent the generation of leak current from the ZnO film 5 of one of adjacent cells to the SnO$_2$ film 3 of the other.

EXAMPLE 6

A photovoltaic module 1 as shown in FIG. 6 was manufactured in the same manner as explained in Example 4 except that the separation groove 24 having a width of 40 μm was formed so as to divide the SnO$_2$ film 3 also. In this embodiment, a plural kinds of modules were manufactured, wherein the thickness of the photovoltaic layers 4a and 4b was set to 250 nm and 3000 nm, respectively, with the thickness of the ZnO layer 5 differing from each other.

Then, the output performances of these modules were investigated under the same conditions as explained in Example 1. The results obtained are shown in the following Table 4.

TABLE 4

| | Thickness (nm) | | | Output performance | | | |
|---|---|---|---|---|---|---|---|
| | Photovoltaic layer | | ZnO | $V_{OC}$ | $J_{SC}$ | F.F. | Eff. |
| | 4a | 4b | film | (V) | (mA/cm$^2$) | (%) | (%) |
| Example 6 | 250 | 3000 | 30 | 1.312 | 11.6 | 69.0 | 10.5 |
| | 250 | 3000 | 50 | 1.352 | 12.0 | 68.5 | 11.1 |
| | 250 | 3000 | 70 | 1.355 | 11.9 | 68.2 | 11.0 |

As apparent from Tables 2 and 4, all of the modules according to Example 6 exhibited a far excellent power generation efficiency as compared with the module according to Comparative Example 2. This merit may be attributed to the facts that since the separation groove 24 was provided in all of the modules according to Example 6, it was possible to increase the open-circuit voltage and to greatly increase the fill factor, though the short-circuit current per unit area was not substantially changed.

Further, it is clear from the comparison between the data shown in Table 2 and the data shown in Table 4 that the modules according to Example 6 tend to exhibit a higher fill factor than the modules according to Example 4. This merit may be attributed to the fact that since the separation groove 24 was disposed so as to partition the $SnO_2$ film 3 in the modules according to Example 6, it was possible to prevent the generation of leak current from the ZnO film 5 of one of neighboring cells to the $SnO_2$ film 3 of the other.

EXAMPLE 7

By means of the following method, the photovoltaic module 1 shown in FIG. 7 was manufactured.

First of all, a glass substrate of 127 mm×127 mm in size whose main surface was provided with an $SnO_2$ film 3 was prepared. Then, with use of YAG IR pulse laser, a laser-scribing of the $SnO_2$ film 3 was performed by laser-scanning parallel with one edge of the substrate 2, thereby forming a separation groove 21 having a width of 40 μm and dividing the $SnO_2$ film 3 into a plurality of stripe-like patterns.

Subsequently, the resultant structure was subjected to ultrasonic cleaning and drying processes. Further, by means of plasma CVD method, a photovoltaic layer 4a having a thickness of 250 nm was formed on the surface of the $SnO_2$ film 3. By the way, this photovoltaic layer 4a had a p-i-n junction, and a non-doped amorphous silicon layer was included therein as a semiconductor layer. Then, a ZnO layer 5 having a thickness of 30 nm was deposited on the surface of the photovoltaic layer 4a by means of sputtering method.

Then, with use of YAG SHG pulse laser, a laser-scribing of the photovoltaic layer 4a and the ZnO layer 5 was performed by laser-scanning parallel with one edge of the substrate 2 and from the substrate side, thereby forming a separation groove 24 having a width of 60 μm and dividing these layers into a plurality of stripe-like patterns. By the way, the center-to-center distance between these separation grooves 21 and 24 was set to 100 μm.

Then, by making use of 0.1% aqueous solution of $HNO_3$ (pH4) as an etching solution, the surface of the ZnO layer 5 was subjected to an etching treatment while giving an ultrasonic vibration. As a result, the conductive fine particles adhering onto the sidewall and bottom of the separation groove 24 were dissolved and removed, and at the same time, the surface of the ZnO layer 5 was roughened, thereby forming a surface-texture structure thereon.

After being dried, by means of plasma CVD method, a photovoltaic layer 4b having a thickness of 3.0 μm was formed on the ZnO film 5. By the way, this photovoltaic layer 4b included a non-doped polycrystalline silicon layer as a semiconductor layer.

Then, with use of YAG SHG pulse laser, a laser-scribing of the photovoltaic layers 4a and 4b and the ZnO layer 5 was performed by laser-scanning parallel with one edge of the substrate 2. As a result, connection grooves 23 each having a width of 60 μm and dividing these layers into a plurality of stripe-like patterns were formed. By the way, the center-to-center distance between the connection groove 23 and the separation groove 24 was set to 100 μm.

Thereafter, by means of sputtering method, a ZnO film (not shown) and an Ag film were successively deposited on the surface of the photovoltaic layer 4b to form a back electrode 6. Then, by laser-scanning parallel with one side of the substrate 2 with use of YAG SHG pulse laser, formed were separation grooves 22 each having a width of 60 μm and dividing a laminate structure including the photovoltaic layers 4a and 4b, the ZnO layer 5 and the back electrode 6 into a plurality of stripe-like patterns. By the way, the center-to-center distance between the separation groove 22 and the connection groove 23 was set to 100 μm.

Then, by making use of 0.1% aqueous solution of $HNO_3$ (pH4) as an etching solution, the surface of the back electrode was subjected to an etching treatment while giving an ultrasonic vibration, thereby removing the conductive fine particles adhered onto the sidewall and bottom of the separation groove 22.

After being dried, by laser-scanning along the periphery of the substrate 2 with use of YAG pulse laser, a groove dividing a laminate structure of the $SnO_2$ film 3, the photovoltaic layers 4a and 4b, the ZnO layer 5 and the back electrode was formed to delimit the power generation region. As a result, eleven columns of photovoltaic cells 10 each having a size of 10 mm×100 mm and connected in series with each other were formed.

Further, a pair of bus bar electrodes 12 were attached to both ends of series array 11 constituted by the cells 10, thereby obtaining the module 1 as shown in FIG. 7.

Then, the output performances of these modules 1 manufactured by the aforementioned method were investigated under the same conditions as explained in Example 1.

As a result, an open-circuit voltage of 1.350V, a short-circuit current density of 12.3 mA/cm², a fill factor of 65.5%, and a conversion efficiency of 10.9% were obtained in each cell 10 of this module 1.

EXAMPLE 8

A photovoltaic module 1 as shown in FIG. 7 was manufactured in the same manner as explained in Example 7 except that 0.1% aqueous solution of NaOH (pH10) was employed as an etching solution in the etching process performed after the formation of the separation grooves 22 and 24.

Then, the output performance of this module 1 was investigated under the same conditions as explained in Example 1. As a result, an open-circuit voltage of 1.366V, a short-circuit current per unit area of 12.1 mA/cm², a fill factor of 66.5%, and a power generation efficiency of 11.0% were obtained in each cell 10 of this module 1.

EXAMPLE 9

A photovoltaic module 1 as shown in FIG. 4 was manufactured in the same manner as explained in Example 7 except that the etching was not performed after the formation of the separation grooves 22 and 24.

Then, the output performance of this module 1 was investigated under the same conditions as explained in Example 1. As a result, an open-circuit voltage of 1.351V, a short-circuit current per unit area of 12.0 mA/cm$^2$, a fill factor of 63.8%, and a conversion efficiency of 10.8% were obtained in each cell 10 of this module 1.

It was confirmed from the results obtained from these Examples 7 to 9 that the aforementioned etching was effective in enhancing the short-circuit current per unit area and the fill factor, and also in improving the conversion efficiency.

EXAMPLE 10

By the following method, the photovoltaic module 1 shown in FIG. 9 was manufactured as will be explained with reference to FIGS. 10A to 10G.

First of all, as shown in FIG. 10A, a glass substrate of 127 mm×127 mm in size whose main surface was provided with an SnO$_2$ film 3 was prepared. Then, as shown in FIG. 10B, by means of plasma CVD method, a photovoltaic layer 4a having a thickness of 0.25 μm was formed on the SnO$_2$ film 3. Additionally, by means of sputtering method, a ZnO layer 5 having a thickness of 30 nm was formed on the photovoltaic layer 4a. By the way, this photovoltaic layer 4a had a p-i-n junction, and a non-doped amorphous silicon layer was included therein as a semiconductor layer.

Then, as shown in FIG. 10C, with use of YAG IR pulse laser and by setting the laser power to 0.4 W, a laser-scribing of a laminate structure including the SnO$_2$ film 3, the photovoltaic layer 4a and the ZnO layer 5 was performed by laser-scanning parallel with one edge of the substrate 2, thereby forming separation grooves 21 each having a width of 70 μm and dividing the laminate structure into a plurality of stripe-like patterns.

Subsequently, the resultant structure was subjected to ultrasonic cleaning and drying processes. Further, as shown in FIG. 10D, by means of plasma CVD method, a photovoltaic layer 4b having a thickness of 3.0 μm was formed on the surface of the ZnO layer 5. By the way, this photovoltaic layer 4b had a non-doped crystalline silicon layer as a semiconductor layer.

Then, as shown in FIG. 10E, with use of YAG SHG pulse laser and by setting the laser power to 0.5 W, a laser-scribing of a laminate structure including the photovoltaic layers 4a and 4b and the ZnO layer 5 was performed by laser-scanning parallel with one edge of the substrate 2, thereby forming connection grooves 23 each having a width of 60 μm and dividing the laminate structure into a plurality of stripe-like patterns. By the way, the center-to-center distance between the laser beam and the separation groove 21 was set to 50 μm so as to enable the beam spot to lie across one of the sidewalls of the separation groove 21 on the occasion of forming the connection groove 23.

Then, as shown in FIG. 10F, by means of sputtering method, a ZnO film and an Ag film were successively deposited on the photovoltaic layer 4b to form a back electrode 6. Then, as shown in FIG. 10G, by laser-scanning parallel with one side of the substrate 2 with use of YAG SHG pulse laser and setting the laser power to 0.7 W, formed were separation grooves 22 each having a width of 60 μm and dividing the laminate structure including the photovoltaic layers 4a and 4b, the ZnO layer 5 and the back electrode 6 into a plurality of stripe-like patterns. By the way, the center-to-center distance between the laser beam and the connection groove 23 was set to 45 μm so as to enable the beam spot to lie across one of the sidewalls of the connection groove 23 on the occasion of forming the separation groove 22.

Thereafter, by laser-scanning along the periphery of the substrate 2 with use of YAG pulse laser, a groove dividing a laminate structure which includes the SnO$_2$ film 3, the photovoltaic layers 4a and 4b, the ZnO layer 5 and the back electrode 6 was formed to delimit the power generation region. As a result, eleven columns of photovoltaic cells 10 each having a size of 10 mm×100 mm and connected in series with each other were formed.

Further, a pair of bus bar electrodes 12 were attached to both ends of series array 11 constituted by the cells 10, thereby obtaining the module 1 as shown in FIG. 9.

Then, the output performances of these modules 1 manufactured by the aforementioned method were investigated under the same conditions as explained in Example 1.

As a result, an open-circuit voltage of 1.350V, a short-circuit current of 122.4 mA, a fill factor of 68.5%, and a conversion efficiency of 11.3% were obtained in each cell 10 of this module 1.

By the way, this module 1 can be considered to have a combination of an element including the photovoltaic layer 4a and an element including the photovoltaic layer 4b. The output performance of each of these elements was calculated from the spectral response characteristics thereof, and a short-circuit current per unit area of 12.92 mA/cm$^2$ in the element including the photovoltaic layer 4a, and 12.42 mA/cm$^2$ in the element including the photovoltaic layer 4b were obtained.

COMPARATIVE EXAMPLE 3

In this comparative example, the module 101 as shown in FIG. 3A was manufactured by the following method.

First of all, in the same manner as explained in Example 10, the structure as shown in FIG. 10D was obtained. Then, with use of YAG SHG pulse laser and by setting the laser power to 0.6 W, a laser-scribing of a laminate structure including the photovoltaic layers 4a and 4b and the ZnO layer 5 was performed by laser-scanning parallel with one edge of the substrate 2, thereby forming connection grooves 23 each having a width of 60 μm and dividing the laminate structure into a plurality of stripe-like patterns. By the way, in contrast to Example 10, the center-to-center distance between the laser beam and the separation groove 21 was set to 100 μm on the occasion of forming the connection groove 23 so as to enable the beam spot to be positioned away from the separation groove 21 by a predetermined distance.

Then, in the same manner as explained with reference to FIG. 10F, a back electrode 6 was deposited as a continuous film on the photovoltaic layer 4b. Then, by laser-scanning parallel with one edge of the substrate 2 with use of YAG SHG pulse laser and setting the laser power to 0.8 W, formed were separation grooves 22 each having a width of 60 μm and dividing the laminate structure including the photovoltaic layers 4a and 4b, the ZnO layer 5 and the back electrode 6 into a plurality of stripe-like patterns. By the way, in contrast to Example 10, the center-to-center distance between the laser beam and the connection groove 23 was set to 100 μm on the occasion of forming the separation groove 22 so as to enable the beam spot to be positioned away from the connection groove 23 by a predetermined distance.

Thereafter, in the same manner as explained in Example 10, the power generation region was delimited. As a result, ten columns of photovoltaic cells 10 connected in series with each other were formed.

Further, a pair of bus bar electrodes 12 were attached to both ends of series array constituted by the cells 10, thereby obtaining the module 101 as shown in FIG. 3A.

Then, the output performance of the module 101 manufactured by the aforementioned method was investigated under the same conditions as explained in Example 1.

As a result, an open-circuit voltage of 1.348V, a short-circuit current of 121.2 mA, a fill factor of 68%, and a conversion efficiency of 11.1% were obtained in each cell 10 of this module 1.

Additional advantages and modifications will readily occur to those skilled in the art. Therefore, the invention is its broader aspects is not limited to the specific details and representative embodiments shown and described herein. Accordingly, various modifications may be made without departing from the spirit or scope of the general inventive concept as defined by the appended claims and their equivalents.

What is claimed is:

1. A photovoltaic module comprising a transparent substrate and hybrid photovoltaic cells arrayed on the substrate and series connected to each other, the cells comprising:
   a back electrode facing the substrate;
   a transparent front electrode intervening between the substrate and the back electrode;
   a first photovoltaic layer intervening between the front and back electrodes and comprising an amorphous semiconductor layer;
   a second photovoltaic layer intervening between the first photovoltaic layer and the back electrode and comprising a crystalline semiconductor layer; and
   a conductive interlayer with a light-transmitting-and-reflecting property intervening between the first and second photovoltaic layers,
   wherein, between a first cell and a second cell being adjacent to each other,
   the front electrode is divided by a first separation groove which is filled with a material of the first photovoltaic layer,
   a laminate structure comprising the first photovoltaic layer, the interlayer, the second photovoltaic layer and the back electrode is divided by a second separation groove which is apart from the first separation groove,
   a laminate structure comprising the first photovoltaic layer, the interlayer and the second photovoltaic layer is divided by a connection groove between the first and second separation grooves, the connection groove being filled with a material of the back electrode so as to electrically connect the back electrode of the first cell to the front electrode of the second cell, and
   a laminate structure comprising the first photovoltaic layer and the interlayer is divided by a third separation groove which is filled with a material of the second photovoltaic layer, the connection groove being positioned between the second and third grooves, and the first and third grooves being spaced apart from each other.

2. The module according to claim 1, wherein, between the cells adjacent to each other, the third separation groove is positioned between the first separation groove and the connection groove.

3. The module according to claim 1, wherein the conductive layer has a thickness in a range of 10 nm to 100 nm and a specific resistance in a range of $1 \times 10^{-3}$ Ω·cm to less than $1 \times 10^{-1}$ Ω·cm.

4. A photovoltaic module comprising a transparent substrate and hybrid photovoltaic cells arrayed on the substrate and series connected to each other, the cells comprising:
   a back electrode facing the substrate;
   a transparent front electrode intervening between the substrate and the back electrode;
   a first photovoltaic layer intervening between the front and back electrodes and comprising an amorphous semiconductor layer;
   a second photovoltaic layer intervening between the first photovoltaic layer and the back electrode and comprising a crystalline semiconductor layer; and
   a conductive interlayer with a light-transmitting-and-reflecting property intervening between the first and second photovoltaic layers,
   wherein, between a first cell and a second cell being adjacent to each other,
   the front electrode is divided by first and fourth grooves which are apart from each other and filled with a material of the first photovoltaic layer,
   a laminate structure comprising the first photovoltaic layer, the interlayer, the second photovoltaic layer and the back electrode is divided by a second separation groove, the second and first separation grooves sandwiching the fourth groove,
   a laminate structure comprising the first photovoltaic layer, the interlayer and the second photovoltaic layer is divided by a connection groove between the fourth and second separation grooves, the connection groove being filled with a material of the back electrode so as to electrically connect the back electrode of the first cell to the front electrode of the second cell, and
   a laminate structure comprising the first photovoltaic layer and the interlayer is divided by a third separation groove which is filled with a material of the second photovoltaic layer and positioned between the first and fourth grooves, a bottom surface of the third separation groove including a surface of the transparent front electrode.

5. The module according to claim 4, wherein the conductive layer has a thickness in a range of 10 nm to 100 nm and a specific resistance in a range of $1 \times 10^{-3}$ Ω·cm to less than $1 \times 10^{-1}$ Ω·cm.

6. A photovoltaic module comprising a transparent substrate and hybrid photovoltaic cells arrayed on the substrate and series connected to each other, the cells comprising:
   a back electrode facing the substrate;
   a transparent front electrode intervening between the substrate and the back electrode;
   a first photovoltaic layer intervening between the front and back electrodes and comprising an amorphous semiconductor layer;
   a second photovoltaic layer intervening between the first photovoltaic layer and the back electrode and comprising a crystalline semiconductor layer; and
   a conductive interlayer with a light-transmitting-and-reflecting property intervening between the first and second photovoltaic layers,
   wherein, between a first cell and a second cell being adjacent to each other,
   the front electrode is divided by a first separation groove which is filled with a material of the first photovoltaic layer, a laminate structure comprising the first photovoltaic layer, the interlayer, the second photovoltaic layer and the back electrode is divided by a second separation groove which is apart from the first separation groove, a laminate structure comprising the first photovoltaic layer, the interlayer and the second photovoltaic layer is divided by a connection groove between the first and second separation grooves, the connection groove being filled with a material of the back electrode so as to electrically connect the back electrode of the first cell to the front electrode of the second cell, and a laminate structure comprising the front electrode, the first photovoltaic layer and the interlayer is divided by a third separation groove which is filled with a material of the second photovoltaic layer, the connection groove being positioned between the second and third grooves, and the first and third grooves being spaced apart from each other.

7. The module according to claim 6, wherein, between the cells adjacent to each other, the third separation groove is positioned between the first separation groove and the connection groove.

8. The module according to claim 6, wherein a bottom surface of the connection groove includes a surface of the substrate and a surface of the front electrode.

9. The module according to claim 6, wherein the conductive layer has a thickness in a range of 10 nm to 100 nm and a specific resistance in a range of $1 \times 10^{-3}$ Ω·cm to less than $1 \times 10^{-1}$ Ω·cm.

* * * * *